United States Patent [19]
Ogura et al.

[11] Patent Number: 5,475,211
[45] Date of Patent: Dec. 12, 1995

[54] PHOTOELECTRIC CONVERSION DEVICE AND INFORMATION PROCESSING APPARATUS WITH RESIN COVERING THE SIDE OF THE PHOTOSENSOR SUBSTRATE

[75] Inventors: Makoto Ogura; Katsumi Komiyama, both of Isehara; Tetsuya Shimada, Zama, all of Japan

[73] Assignee: Canon Kabushiki Kaisha, Tokyo, Japan

[21] Appl. No.: 170,690

[22] Filed: Dec. 21, 1993

[30] Foreign Application Priority Data

Dec. 24, 1992 [JP] Japan ................... 4-357275

[51] Int. Cl.⁶ .................................. H01J 40/14
[52] U.S. Cl. ...................... 250/208.1; 358/471
[58] Field of Search ............... 250/208.1, 214.1; 358/471, 482, 483, 475; 348/294

[56] References Cited

U.S. PATENT DOCUMENTS

| | | | |
|---|---|---|---|
| 4,740,796 | 4/1988 | Endo et al. | 346/1.1 |
| 4,845,375 | 7/1989 | Tsushima | 250/578 |
| 5,101,285 | 3/1992 | Kawai et al. | 358/471 |
| 5,138,145 | 8/1992 | Nakamura et al. | 250/208.1 |
| 5,162,644 | 11/1992 | Nagata et al. | 250/208.1 |
| 5,196,691 | 3/1993 | Kitani et al. | 250/208.1 |
| 5,321,249 | 6/1994 | Nomura | 250/208.1 |

FOREIGN PATENT DOCUMENTS

| | | |
|---|---|---|
| 0410395 | 1/1991 | European Pat. Off. . |
| 0480418 | 4/1992 | European Pat. Off. . |
| 04247956 | 9/1982 | Japan . |
| 58-082580 | 5/1983 | Japan . |
| 58-194564 | 11/1983 | Japan . |
| 60-219524 | 11/1985 | Japan . |
| 62-293766 | 12/1987 | Japan . |
| 03207158 | 10/1991 | Japan . |

OTHER PUBLICATIONS

Patent Abstracts of Japan, vol. 010, No. 084 (P–442), Apr. 3, 1986.
Patent Abstracts of Japan, vol. 007, No. 178 (E–191), Aug. 6, 1983.
Patent Abstracts of Japan, vol. 012, No. 189 (E–616), Jun. 2, 1988.
Patent Abstracts of Japan, vol. 015, No. 479, (E–1141), Dec. 5, 1991.
Patent Abstracts of Japan, vol. 017, No. 021 (M–1353), Jan. 14, 1993.
Patent Abstracts of Japan, vol. 008, No. 037 (M–277), Feb. 17, 1984.

*Primary Examiner*—Edward P. Westin
*Assistant Examiner*—Steven L. Nichols
*Attorney, Agent, or Firm*—Fitzpatrick, Cella, Harper & Scinto

[57] ABSTRACT

A photoelectric conversion device and an information processing apparatus having the device, provided with a photosensor substrate having a plurality of photoelectric conversion elements on a light transparent substrate and a mounting plate having a resin covering the side of the photosensor substrate, including a region where the surface of the mounting plate and the surface of the photosensor substrate are substantially continuous, wherein the mounting plate and the photosensor substrate are integrated without forming level difference between the surface of mounting plate and the surface of photosensor substrate so as to be combined together simply and with low costs.

46 Claims, 18 Drawing Sheets

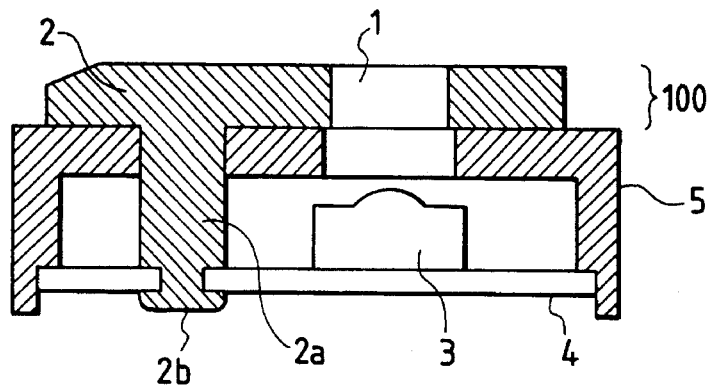
FIG. 11
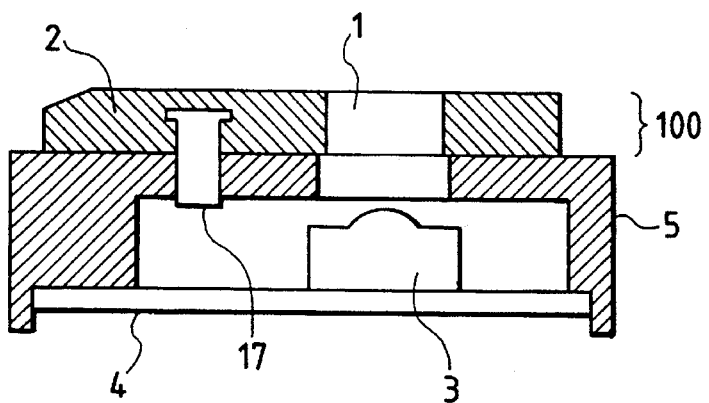
FIG. 12
FIG. 13
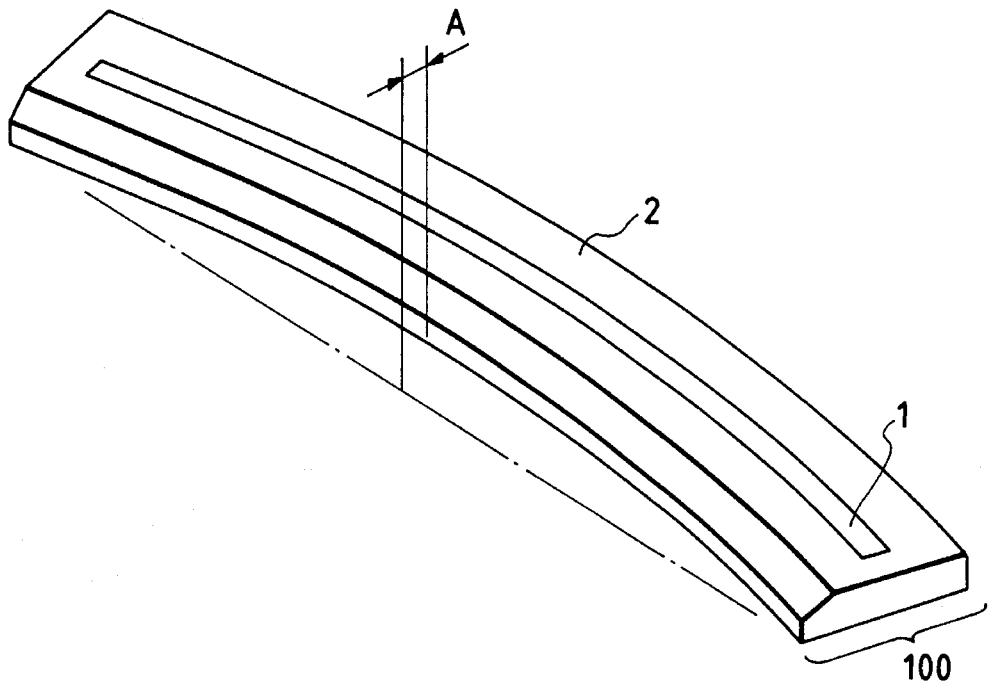

PHOTOELECTRIC CONVERSION DEVICE AND INFORMATION PROCESSING APPARATUS WITH RESIN COVERING THE SIDE OF THE PHOTOSENSOR SUBSTRATE

BACKGROUND OF THE INVENTION

1. Field of the Invention

The present invention relates to a photoelectric conversion device and an information processing apparatus having the device, and particularly to a photoelectric conversion device and an information processing apparatus having the device, which is applicable as an input unit of the information processing apparatus, such as a facsimile apparatus, an image reader, a digital copying machine, and an electronic black board, which reads the image information of an original in such a way so as to carry the original in contact with a primary line sensor while moving the original relative to the sensor.

2. Related Background Art

In recent years, long line sensors usable in actual size systems such as photoelectric conversion devices have been developed, because image processing apparatuses, such as facsimile apparatuses and image readers, are smaller and have higher performance. Also, for purposes of smaller configuration and lower costs, a photoelectric conversion device and an information processing apparatus using the device have been proposed wherein a sensor is employed to directly detect a reflected light from the original, via a transparent spacer made of glass, without the use of actual-size fiber lens array.

FIG. 1 is a typical cross-sectional view illustrating a neighborhood around an original reading unit in an information processing apparatus, FIG. 2 is a typical cross-sectional view illustrating a wiring portion Of a photoelectric conversion device in the information processing apparatus of FIG. 1, and FIG. 3 is a perspective view of a photoelectric conversion devices (Note that each member constituting a photosensor substrate is shown in a different size between views for the purpose of easy understanding).

In each view, 1 is a photosensor substrate formed with photoelectric conversion elements and a protective layer on a glass substrate, 12 is a guide member for conveying a original, 15 is a transparent support substrate made of, for example glass, 5 is a base plate, such as a metallic frame made of Al, and 3 is a light source such as an LED array, EL, or a xenon lamp. The guide member 12 has its upper surface positioned above the sensor substrate, and is bonded to the side face of the photosensor substrate, with its height strictly adjusted with reference to the upper surface of the photosensor substrate 1. Also, 1a is a first circuit connecting part, formed of Al or Cr, 6 is a second circuit connecting part, formed by printing conductive paste, and 16 is a bonding wire made of Al or Au. Note that the base plate 5 may be a resin frame, as long as it has a higher rigidity and a stabler dimensional precision than the photoelectric conversion device.

However, the photoelectric conversion device and the information processing apparatus as described above will cause the following problem if attempting to lower costs and provide a smaller construction.

One means for achieving a lower costs and smaller construction of a photoelectric conversion device may involve reducing the width of the photosensor substrate, in other words, the width of the photosensor substrate in an original conveying direction. Herein, the lower costs can be achieved because the photosensor substrate is usually made by dividing a number of arrays consisting of photoelectric conversion elements formed on a large glass substrate, and with the smaller width of the photosensor substrate, a greater number of arrays consisting of photoelectric conversion elements can be obtained within one large substrate.

However, if the width of photosensor substrate in the original conveying direction is too small, there is a problem that the end portion of guide member 12, and a platen roller (as disposed on the photosensor substrate), for the conveyance would approach or collide with each other, causing an unfocused image or oblique running of the original.

SUMMARY OF THE INVENTION

An object of the invention is to provide a photoelectric conversion device suitable for a smaller construction and lesser weight, capable of making the width of a photosensor substrate narrower, and to provide an information processing apparatus having the device.

Also, it is another object of the present invention to provide a photoelectric conversion device which does not produce unfocused read images and does not cause erroneous operations such as an oblique running, or jamming of an original, even if the width of the photosensor substrate is narrowed, and to provide an information processing apparatus having the device.

In addition, it is a further object of the invention to reduce the cost of not only the photoelectric conversion device but also the information processing apparatus having the device.

Also, it is another object of the invention to provide a photoelectric conversion device which can facilitate the mounting operation and provide better mounting precision, and an information processing apparatus having the device.

Further, it is another object of the invention to provide a photoelectric conversion device having a constitution capable of reducing the number of components, and suppressing the occurrence of distortion, such as a warpage, due to heat still further, and an information processing apparatus having the device.

Also, it is another object of the invention to provide a photoelectric conversion device which is capable of further reducing external light or stray light from entering the photoelectric conversion element, and further improving the S/N ratio of reading, and an information processing apparatus having the device.

Further, it is another object of the invention to provide a photoelectric conversion device which can protect the wiring portion, such as a wire bonding, easily and securely, and an information processing apparatus having the device.

BRIEF DESCRIPTION OF THE DRAWINGS

FIG. 11, FIG. 12, FIG. 14A and FIG. 15 are cross-sectional views illustrating the mounting of the photoelectric conversion device of the present invention to the base plate.

FIG. 13 is a perspective view for exemplifying a warped state of substrate 100.

DETAILED DESCRIPTION OF THE PREFERRED EMBODIMENTS

Figure 1:
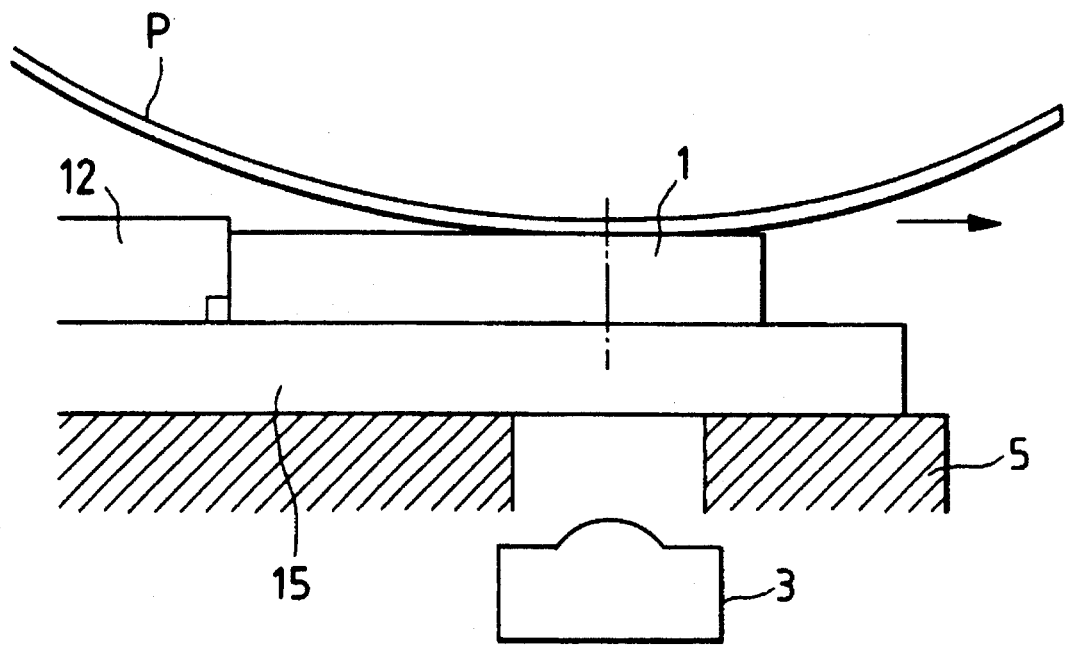
FIG. 1 is a typical cross-sectional view illustrating a neighborhood of an original reading unit of an information processing apparatus.

The above-mentioned objects can be accomplished by a photoelectric conversion device and an information processing apparatus having the device, the photoelectric conversion device comprising a mounting plate covering at least the sides of a photosensor substrate at least having photoelectric conversion elements, wherein a continuous area is provided between the surface of said mounting plate and at least a part of the surface of said photosensor substrate.

The photoelectric conversion device of the present invention preferably has a light transparent protective layer on the photoelectric conversion elements.

Also, the photoelectric conversion device of the present invention preferably has said mounting plate provided with a resin.

Further, the photoelectric conversion device of the present invention desirably has a convex or concave portion serving as the reference for attaching the other member on the mounting plate.

Also, the photoelectric conversion device of the present invention preferably has a first circuit connecting part on the photosensor substrate for electrically connecting the photoelectric conversion elements to external circuit.

Also, the photoelectric conversion device of the present invention preferably has the mounting plate opaque or substantially opaque, but the mounting plate may be translucent.

It is preferable that the photoelectric conversion device of the invention, to read image information, is configured such that light passing through the photosensor substrate illuminates an image holding member, and light reflected from the image holding member is received by the photoelectric conversion elements.

Also, the photoelectric conversion device of the present invention preferably has the mounting plate provided with a second circuit connecting part for electrically connecting to the first circuit connecting part.

Also, the photoelectric conversion device of the invention preferably has the photosensor substrate having a width smaller than the nip width for a platen roller for conveying the image holding member.

The photoelectric conversion elements of the photoelectric conversion device of the invention are desirably disposed in a substantially central portion of the photosensor substrate in the width direction.

Also, the photoelectric conversion device of the invention preferably has the second circuit connecting part provided with the wirings formed by using a conductive paste.

Also, the photoelectric conversion device of the invention preferably has the second circuit connecting part formed integrally within the mounting plate.

Also, the photoelectric conversion device of the invention preferably has the first circuit connecting part and the second circuit connecting part covered with a sealing material.

The photoelectric conversion elements of the photoelectric conversion device of the invention are preferably disposed in a substantial central portion of the nip width.

Also, the photoelectric conversion device of the invention desirably has the second circuit connecting part formed on a terminal portion of the first circuit connecting part and the mounting plate simultaneously.

Also, the photoelectric conversion device of the invention preferably has the first circuit connecting part and the second circuit connecting part provided with an antisagging portion of sealing material at least in part around the periphery thereof, the antisagging portion being preferably made of a resin of the mounting plate.

The information processing apparatus of the present invention may comprise a photoelectric conversion device, a base plate holding the photoelectric conversion device, a light source illuminating an image holding member, a conveying unit for conveying said image holding member, and a controller for controlling at least one of said photoelectric conversion device for the image reading, said light source, and said conveying unit.

In the present invention, the photoelectric conversion device is preferably mounted on said base plate based on the mounting reference, and preferably has an output unit for outputting the records based on an electric signal carrying the image information, as necessary.

With the photoelectric conversion device of the invention, the mounting plate and the photosensor substrate can be integrally formed without substantial step between the surface of the mounting plate and the surface of the photosensor substrate in such a manner that the sides of the photosensor substrate are covered with the mounting plate having a resin to make the surface of the mounting plate and the surface of the photosensor substrate substantially continuous.

Also, with the photoelectric conversion device of the invention, the mounting operation onto the other member can be made easier with a better mounting precision by providing a convex or concave portion on the mounting plate, serving as the mounting reference with the other member. Thereby the mounting plate can be directly mounted on the other member and a transparent support substrate 15 as shown in FIG. 1, for example, can be dispensed with, resulting in less components, smaller construction and lighter weight. Also, the warpage arising due to thermal shrinkage in forming the mounting plate can be corrected by, for example, fitting the convex or concave portion of the mounting plate into a convex or concave portion formed on the other member.

Further, with the photoelectric conversion device of the invention, the first circuit connecting part for electrically connecting the photoelectric conversion elements to an external circuit is provided on the photosensor substrate to allow the first circuit connecting part to be formed simultaneously with the electrodes of photoelectric conversion elements, so that the manufacturing process can be simplified.

In addition, with the photoelectric conversion device of the invention, external light (light with noise incident from the external such as room light or solar rays) can be especially prevented from penetrating through the mounting plate by providing an opaque mounting plate.

Also, with the photoelectric conversion device of the invention, stray light (light with noise incident on the photoelectric conversion element, reflected from other than the original face) can be especially decreased by providing a transparent mounting plate, whether the width of photosensor substrate is large or small.

Figure 3:
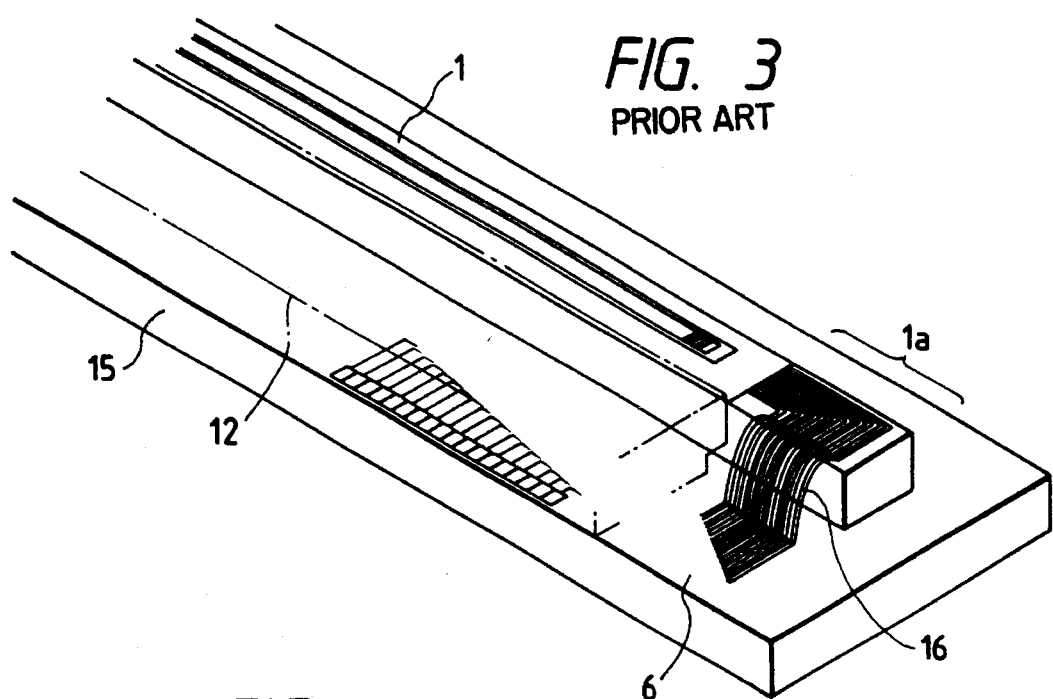
FIG. 3 is a perspective view of a photoelectric conversion device.

Also, with the photoelectric conversion device of the invention, the first circuit connecting part and the second circuit connecting part can be connected in a simple fabrication process by providing the second circuit connecting part for electrically connecting to the first circuit connecting part on the mounting plate. That is, the step as shown in FIG. 3 can be eliminated by making the surface of the mounting plate and the surface of the photosensor substrate substantially continuous, so that the connection therebetween can be made easier.

Further, with the photoelectric conversion device of the invention, external light can be further prevented from entering and the S/N ratio can be further improved by making the width of photosensor substrate smaller than the nip width (collapse width of roller) of platen roller conveying the image holding member.

With the photoelectric conversion device of the invention, the influence of stray light from the photosensor substrate can be further reduced by disposing the photoelectric conversion elements in a central or substantially central portion of the photosensor substrate in the width direction.

With the photoelectric conversion device of the invention, the patterned wiring can be collectively made by forming the second circuit connecting part as the wiring having a conductive paste.

With the photoelectric conversion device of the invention, the second circuit connecting part is formed integrally within the mounting plate by, for example, embedding a metallic wiring or wire into the mounting plate to fabricate the second circuit connecting part and the mounting plate simultaneously, and protect the wiring portion.

Further, with the photoelectric conversion device of the invention, the first circuit connecting part and the second circuit connecting part are covered with a sealing material to further protect the circuit wiring portion and the wire bonding portion.

Also, with the photoelectric conversion device of the invention, the photoelectric conversion elements are disposed in a central or substantially central portion of the nip width to further effectively prevent the external light from entering.

With the photoelectric conversion device of the invention, the second circuit connecting part is simultaneously formed on a terminal portion of the first circuit connecting part and the mounting plate to form the patterned second circuit connecting part collectively and make a connection to the first circuit connecting part at the same time, resulting in a further simplified manufacturing process of the wirings.

In addition, with the photoelectric conversion device of the invention, the sealing material can be prevented from flowing into any other area than the circuit connecting part by providing an antisagging portion of sealing material at least in part around the periphery of the first circuit connecting part and the second circuit connecting part, the antisagging portion being created simultaneously with the mounting plate by forming the antisagging portion of a resin of the mounting plate.

The information processing apparatus of the invention uses the photoelectric conversion device of the invention which is fabricated as a separate component mountable on the base plate, so that the photoelectric conversion device can be used commonly, whereby the mounting operation is more efficient, and the mounting precision higher, by mounting the photoelectric conversion device onto the base plate based on the mounting reference.

[EXAMPLES]

The examples of the present invention will be described below with reference to the drawings.

(Example 1)

Figure 4:
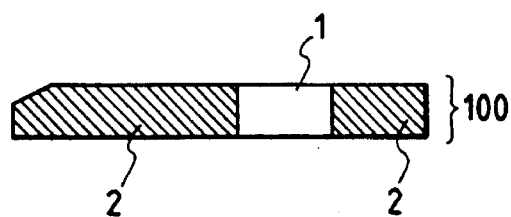
FIG. 4, FIG. 9, FIG. 16, FIG. 18, FIG. 19, FIG. 20 and FIG. 27 are cross-sectional views of the photoelectric conversion device of the present invention.
Figure 5:
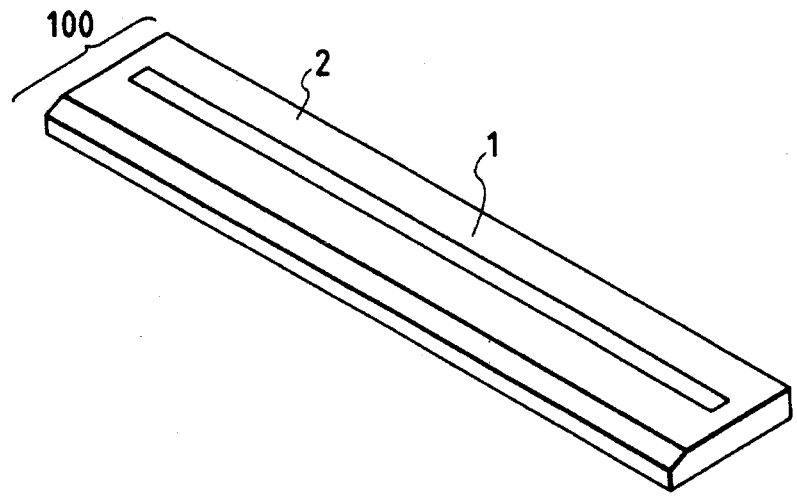
FIG. 5 is a perspective view of the photoelectric conversion device of FIG. 1.

FIG. 4 is a cross-sectional view of a photoelectric conversion device of the invention in example 1 and FIG. 5 is a perspective view of the photoelectric conversion device.

Figure 2:
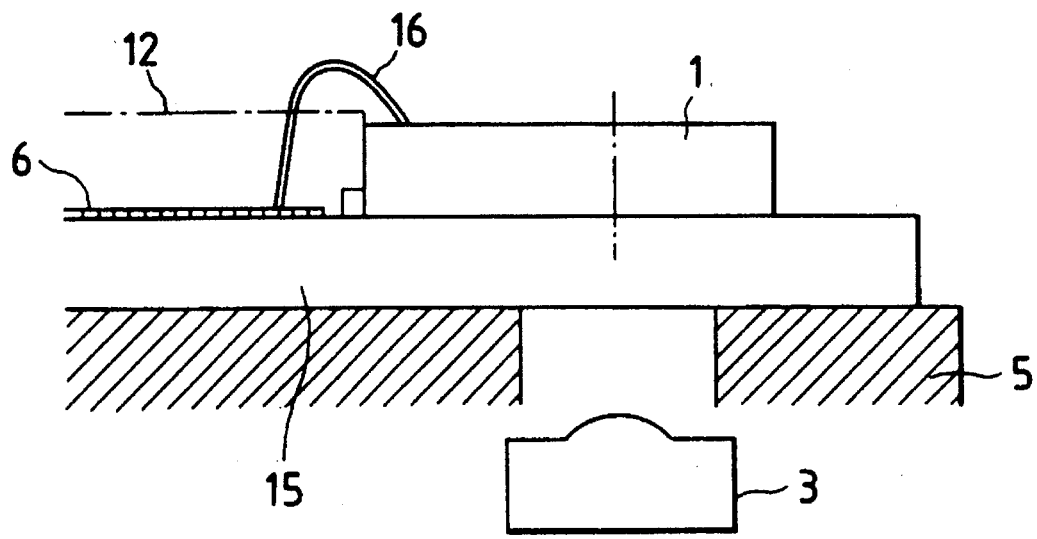
FIG. 2 is a typical cross-sectional view illustrating a wiring section of a photoelectric conversion device.

In FIGS. 4 and 5, 1 is a photosensor substrate having photoelectric conversion elements and a protective layer on a transparent substrate made of glass, 2 is a mounting plate covering the sides of the photosensor substrate 1, and 100 is a base board having the photosensor substrate 1 and the mounting plate 2. The photosensor substrate 1 is formed integrally with the mounting plate to thereby make up the base board 100, which can be directly mounted on a base plate 5 as shown in FIG. 2. In this way, if the photosensor substrate 1 is formed integrally with the mounting plate 2 and separately from the base plate 5, the base board 100 can be utilized as the common component, resulting in greater universality, more simplified format or installation, and lower costs. Also, the base board 100 and the base plate 5 can be disassembled for recycling. Also, the base board 100 is modularized to subject the base board 100 to separate inspection, whereby the apparatus incorporating the base board 100 can have a higher yield of assembly. Note that the mounting plate 2 can have a function of guiding the original.

The upper surface of the photosensor substrate 1 and the upper surface of the mounting plate 2 are made substantially continuous, so that even if the mounting plate 2 and the platen roller for conveyance (not shown) make contact with each other on the reduced width of the photosensor substrate 1 in an original conveying direction, there is no disadvantage, such as an unfocused image or oblique running of the original, caused by the step between the photosensor substrate and the mounting plate. That is, it is possible to eliminate the jamming or an oblique running of original, or unfocused image, by making the upper surface of the photosensor substrate 1 and the upper surface of the mounting plate 2 flush. Also, it is desirable that there is no clearance between the mounting plate 2 and the photosensor substrate 1, but if there is a clearance, it is preferable to make it smaller than at least the thickness of original to be conveyed, and more preferably, equal to or less than one-half the thickness of original.

Figure 6:
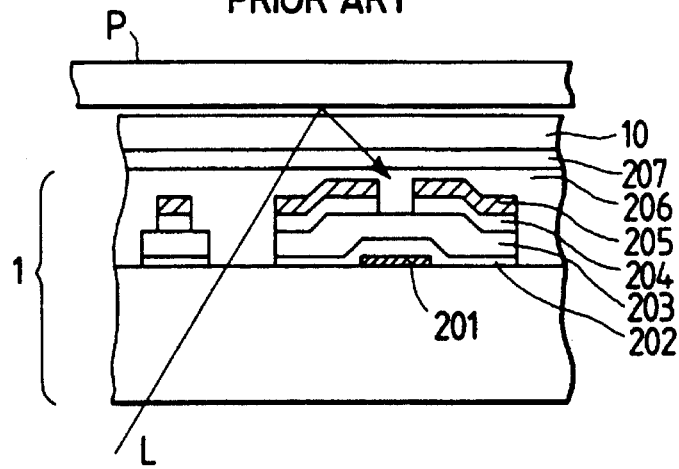
FIG. 6 and FIG. 7 are typical cross-sectional views illustrating the constitution of a photosensor substrate.
Figure 7:
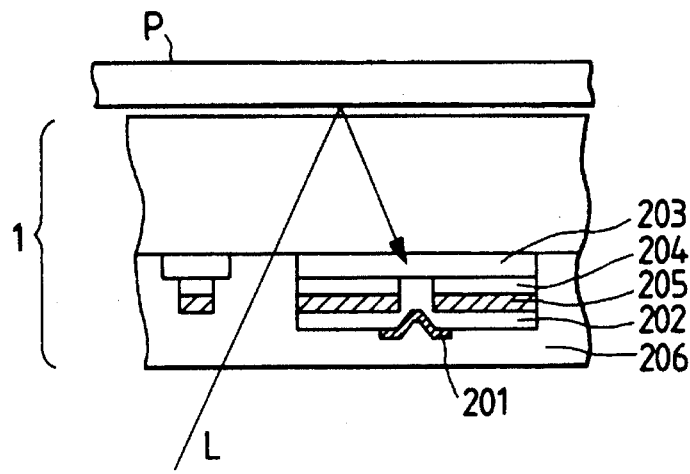

The photosensor substrate 1 may be constituted as shown in FIGS. 6 and 7, for example. The photosensor substrate of FIG. 6 makes light incident from the back side of the glass substrate, while the photosensor substrate of FIG. 7 makes light incident from the sensor formation face side of the glass substrate. In both figures, 201 is a light shielding layer made of Al or Cr, 202 is an insulating layer made of SiN, 203 is an i-type semiconductor layer made of a-Si, 204 is an $n^+$-type ohmic contact layer made of a-Si, 205 is a main electrode made of Al, 206 is a passivation layer made of SiN or polyimide, 207 is an adhesive layer made of epoxy resin, 10 is a thin, transparent protective layer made of glass, which are respectively provided on the glass substrate. P is a reading original (image holding member).

The mounting plate 2 is composed of a material selected from a variety of synthetic resins as presented below. That is, a variety of thermoplastic resins, including thermoplastic polyester resins such as polybutylene terephthalate resin and polyethylene terephthalate resin, copolymer of polyester resin with other resins, mixtures thereof, polymer alloy, modified polyester and polyphenylene sulfide resin, polyamide resin, polyimide resin, polyesterimide resin, polypropylene resin, AS resin, ABS resin, polycarbonate resin, polyallylsulfone resin, polysulfone resin, polyacetal resin, polyethersulfone resin, polyethylene resin, polyvinyl chloride, polyetheretherketone resin, fluororesin, polyphenylene oxide resin, (meta)acrylic resin, thermoplastic and polyurethane resin, and thermosetting resins including phenolic resin, unsaturated polyester resin, furan resin, alkyd resin, allyl resin, melamine resin, silicone resin, thermosetting polyurethane resin vinylester resin, and urea resin. There resins preferably have reinforcing fiber mixed as the reinforcing material, as necessary. Specific examples of the reinforcing member to be mixed preferably include inorganic fibers such as glass fiber, carbon fiber, boron fiber, fused quartz fiber, silica fiber, alumina fiber, zirconia fiber, boron nitride fiber, silicon nitride fiber, boron carbide fiber, silicon carbide fiber, asbestos fiber and metal fiber, natural fibers such as hemp, vinylon, polyamide and polyester, and synthetic resins. The preferable examples of the resin may include non-shrinkable thermosetting resins (BMC) and urethane resin. Also, 10 the reinforcing member may be metal such as Al, Fe, Ni, Cu, Cr or an alloy having such element.

The base board 100 can be manufactured in accordance with a manufacturing method as explained below in connection with FIGS. 8A to 8G, for example.

Figure 8A:
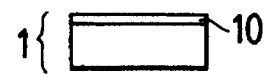
FIGS. 8A to 8G are cross-sectional views illustrating a manufacturing process for a photoelectric conversion device of the present invention.

1. First, a photosensor substrate 1 is fabricated by forming photoelectric conversion elements on a glass substrate, and then forming a transparent protective layer 10 made of a transparent glass thereon, as shown in FIG. 8A.

2. The photosensor substrate 1 is placed at a predetermined position on a lower half 209 of a mounting plate forming mold, as shown in FIG. 8B.

3. Further, an upper half 208 of the mold is directly put on the surface of transparent protective layer 10, as shown in FIG. 8C. This allows the mounting plate 2 to be formed continuously from the surface of transparent protective layer 10, with reference to the surface of transparent protective layer 10.

Figure 8B:
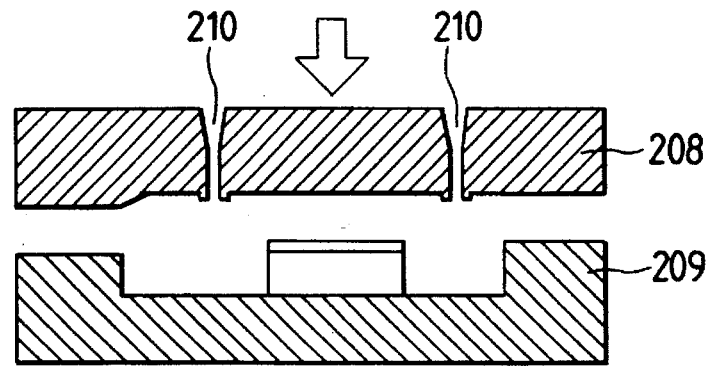
Figure 8C:
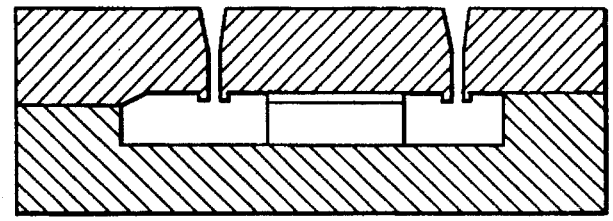

Note that an inlet opening 210, for pouring a material forming the mounting plate 2, is provided on the upper half 208, as shown in FIG. 8B. The material of the upper half 208 is required to have the elasticity and releasability, and may be preferably silicone or rubber. The requirement of elasticity is to cause no flaw on the transparent protective layer 10 and to absorb a distortion in flatness of the photosensor substrate 1.

Figure 8D:
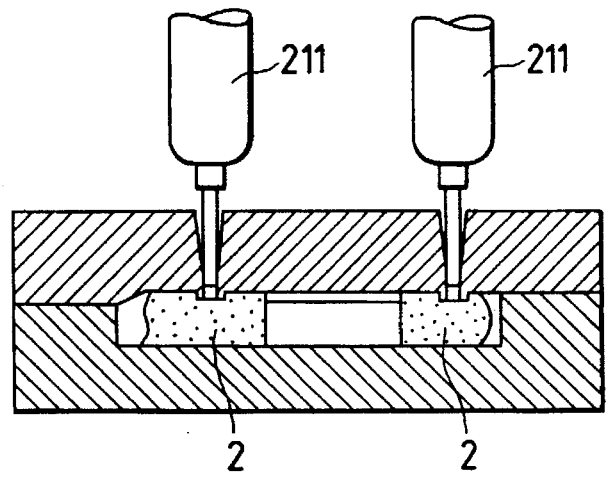

4. The material forming the mounting plate 2 is injected through the inlet opening 210 of the upper half 208 into a space constituted of the upper half 208, the lower half 209 and the photosensor substrate 1, using an injector 211, e.g., a dispenser, as shown in FIG. 8D.

Figure 8E:
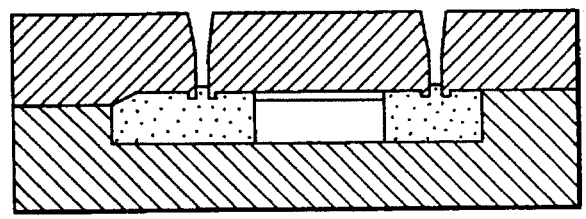

5. The material is cured after filling of the material, as shown in FIG. 8E.

Figure 8F:
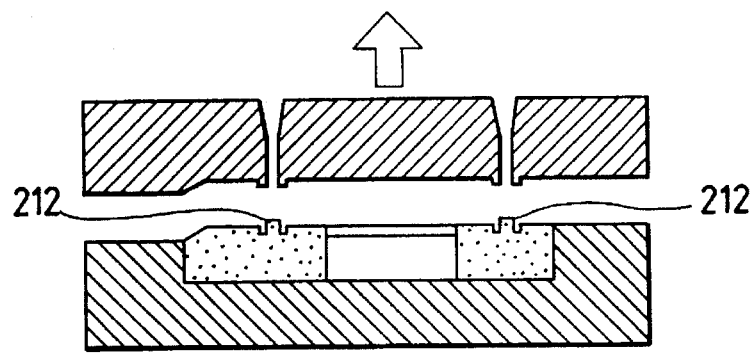

6. The upper half 208 is removed after the material is cured, as shown in FIG. 8F. Then, the burr may be produced by the influence of the inlet opening 210.

Figure 8G:
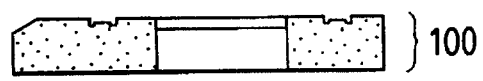

7. The base board 100 having the photosensor substrate 1 and the mounting plate 2 integrally formed is manufactured after the burr 212 is removed, as shown in FIG. 8G. Note that the inlet opening 210 is provided on the upper half 208 in this manufacturing method, but may be provided on the lower half 209. Also, the material forming the mounting plate is not limited to the filling from the upper or lower side, but may be poured from the lateral side.

Figure 9:
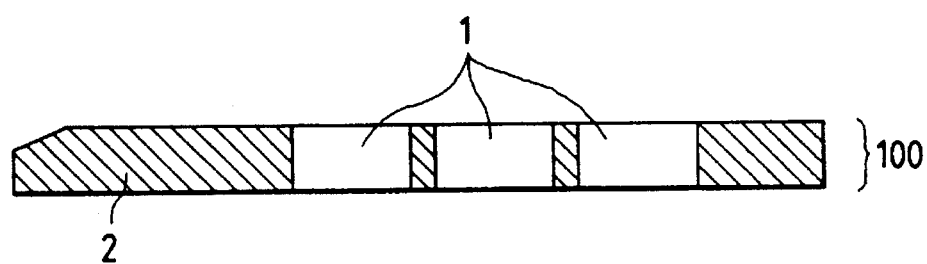

FIG. 9 is a cross-sectional view showing an example where three photosensor substrates are arranged integrally. This example is used for constituting a color sensor unit, wherein three photosensor substrates 1 of red (R), green (G) and blue (B) can be formed integrally with the mounting plate 2. Thereby, even with the color configuration, the positioning precision between each sensor can be enhanced, and the mounting of apparatus can be easily performed without any change from the monochrome configuration.

(Example 2)

Figure 10A:
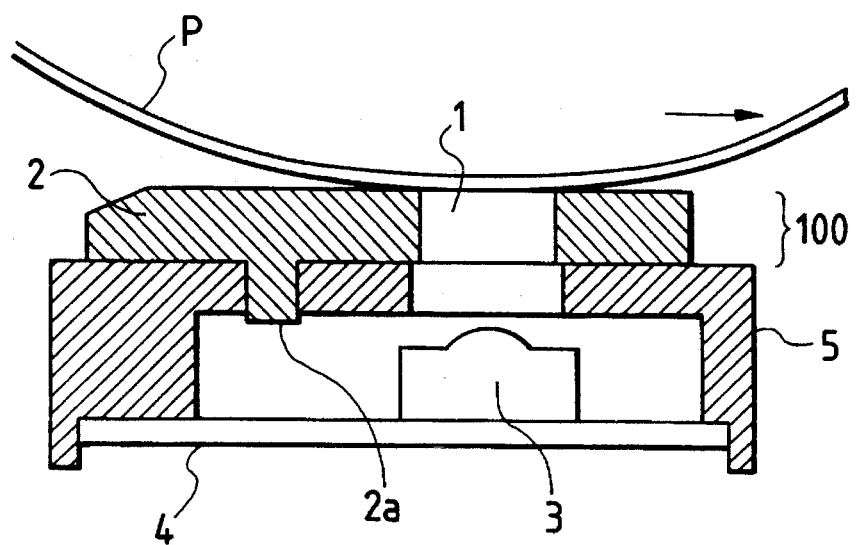
FIG. 10A, FIG. 25 and FIG. 26 are cross-sectional views showing a neighborhood of the original reading unit in the information processing apparatus having the photoelectric conversion device of the present invention.
Figure 10B:
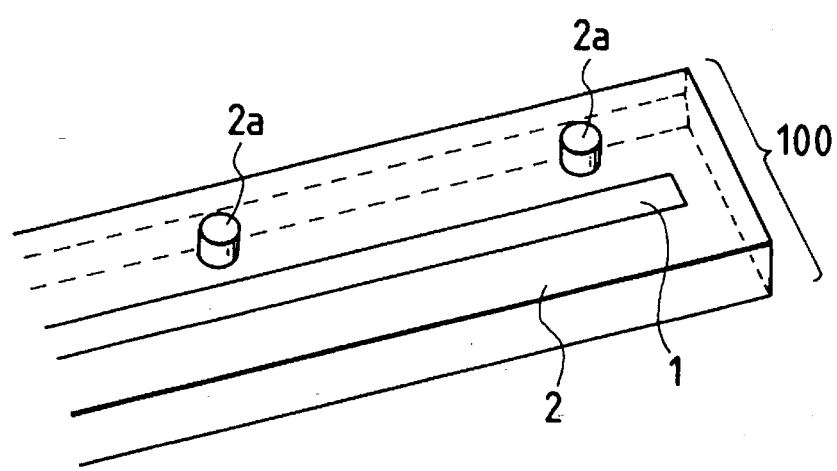
FIG. 10B is a perspective view of the photoelectric conversion device as shown in FIG. 10A.

FIG. 10A is a cross-sectional view of a photoelectric conversion device in this example, and FIG. 10B is a typical perspective view from its back face.

In FIG. 10A, a base board 100 is mounted on a base plate 5 (which is provided with a concave portion corresponding to a reference convex portion 2a) with reference to the reference convex portion 2a.

The reference convex portion 2a is made as a part of the mounting plate 2 (of the same material as the mounting plate 2). The shape of the reference convex portion 2a is cylindrical in this example, as shown in FIG. 10B, but is not specifically limited thereto, and may be prismatic or linearly provided, for example. Also, it is unnecessary that the reference convex portion 2a may fit through the base plate 5.

Note that the reference convex portion 2a may be enlarged to provide a caulking portion 2b at the top end for the mounting on the support substrate 4, as shown in FIG. 11. Also, it may be secured by thermally fusing the reference convex portion 2a projecting out of a hole of the base plate 5. With such a constitution, the base board 100, the base plate 5 and the support substrate 4 can be unified. Note that the support substrate 4 has a light source such as LED array, EL or xenon lamp held thereon, and IC mountable thereon.

As shown in FIG. 12, the reference convex portion 2a may be made of a different material from the mounting plate 2. In FIG. 12, 17 is an insert reference member made of a metal such as SUS.

According to this example, a mounting member, such as a screw, is unnecessary, and even when the mounting member such as a screw is necessary, the assembly is made easier. Since the position is defined by the fitting of convex and concave portions, the mounting precision is enhanced. Further, since the base board 100 is directly mounted on the base plate 5, the transparent support member 15 as shown in FIG. 1 can be dispensed with, and therefore the number of components can be reduced. As a result, the apparatus having the photoelectric conversion device incorporated can be smaller and lighter. Note that the base plate 5 is a frame made of a metal such as Al, but may be a frame made of a resin as long as it has more rigidity and stabler dimensional precision than the photoelectric conversion device. Also, it may be a frame made of a mixture of metal and resin.

(Example 3)

In the above manufacturing process as explained in connection with FIGS. 8A to 8G, the base board 100 may warp in some cases 13 as shown in FIG. 13 due to a difference in thermal expansion coefficient between the resin material of mounting plate 2 and the material of photosensor substrate. Herein, A indicates the amount of warpage, and this warpage is deemed to occur due to thermal shrinkage mainly in forming the mounting plate. One measure for relieving this problem is to configure the mounting plate 2 around the photosensor substrate in axial symmetry. In this case, it is made in axial symmetry around the photoelectric conversion element array.

Figure 14A:
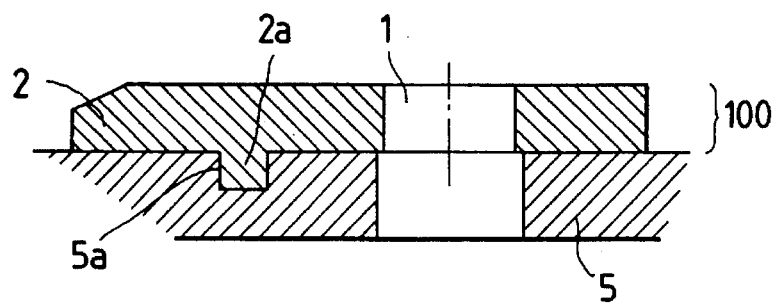
Figure 14B:
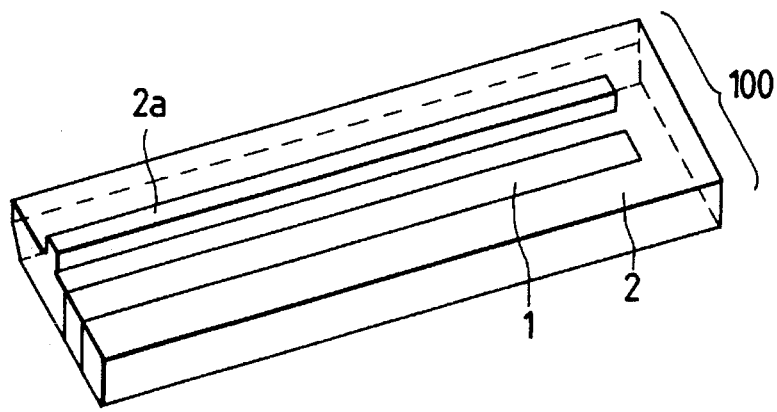
FIG. 14B is a perspective view of the photoelectric conversion device as shown in FIG. 14A.

FIG. 14A is a cross-sectional view of a photoelectric conversion device in this example, and FIG. 14B is a perspective view from its back face.

This example is provided with a reference convex portion 2a along a line as shown in FIGS. 14A and 14B to correct for the warpage of FIG. 9. Herein, as shown in FIG. 13, even if warpage occurs, the warpage can be corrected by fitting the reference convex portion 2a warped into a concave portion 5a of the base plate 5 having no warpage.

Figure 15:
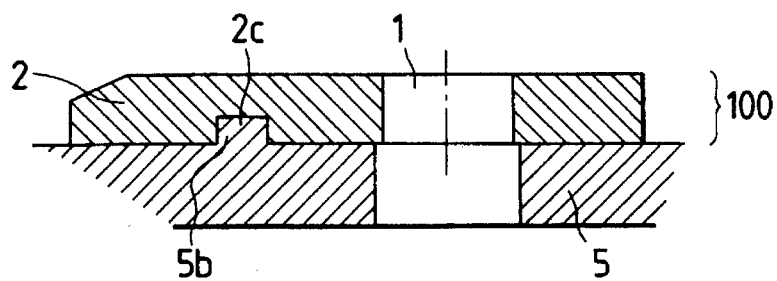

Note that the base board 100 may be provided with a reference concave portion 2c (which is fitted to the mounting plate 2), as shown in FIG. 15, with the base plate 5 provided with a convex portion 5b, whereby the same effect can be expected. Of course, the reference convex portion 2a may be provided entirely or partly on the substrate 100 in a longitudinal direction. Also, it is needless to say that the reference convex portion 2a may be divided into a plurality of sections.

(Example 4)

Figure 16:
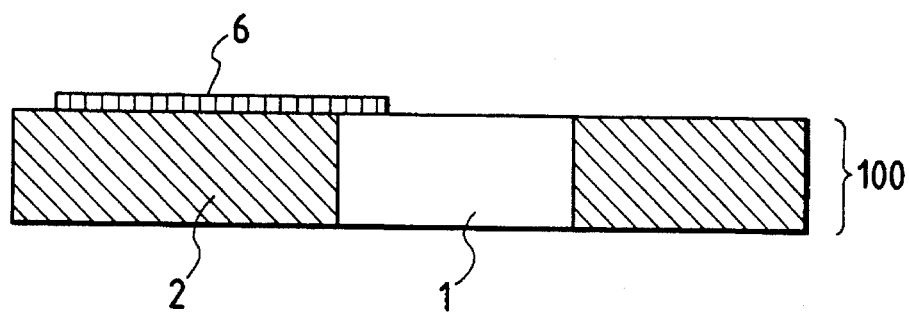
Figure 17:
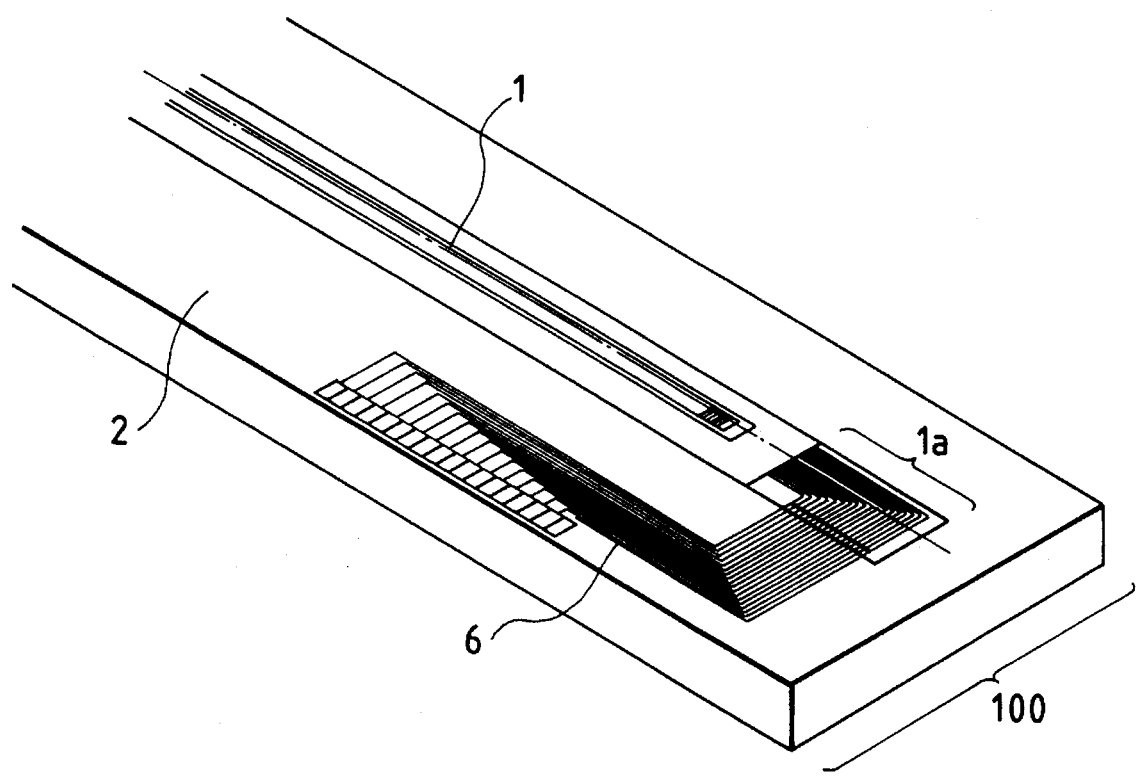
FIG. 17, FIG. 21, FIG. 22, FIG. 23A, FIG. 23B, FIG. 24 and FIG. 28 are cross-sectional views of the photoelectric conversion device of the present invention.

FIG. 16 is a cross-sectional view of a photoelectric conversion device in this example, and FIG. 17 is a perspective view thereof.

This example is provided with a first circuit connecting part 1a and a second circuit connecting part 6 on the photosensor substrate 1 and the mounting plate 2, respectively, as shown in FIG. 17, to effect the connection to the external circuit.

The first circuit connecting part 1a is suitably made of the same material as the electrode of the photoelectric conversion element such as Al or Cr. Also, the second circuit connecting part 6 can be made by printing with a conductive paste containing Ag, carbon or solder grains, or plating Ag, Au, Cr, or Ni, or vapor depositing Au, Al, Cr, or Ni. In particular, the printing with conductive paste allows the second circuit connecting part 6 to be formed in pattern collectively in a relatively simple process, and at the same time be connected to the first circuit connecting part 1a, and thus is suitably used in this example. The mounting an plate 2 is capable of mounting IC thereon, so that the noise can be reduced because the length of wiring can be shortened.

Figure 18:
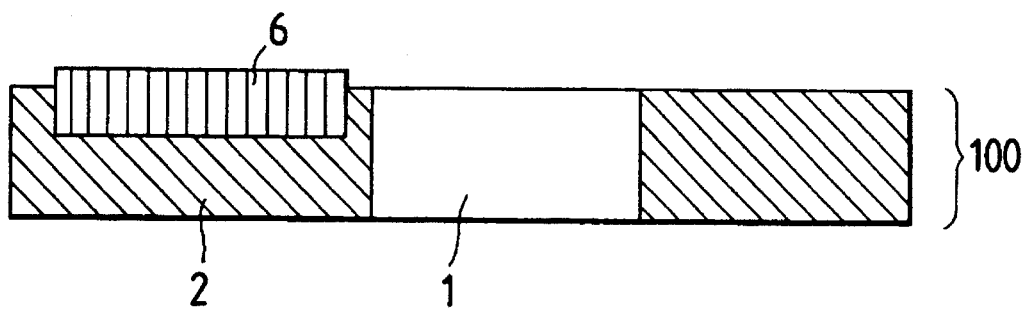
Figure 19:
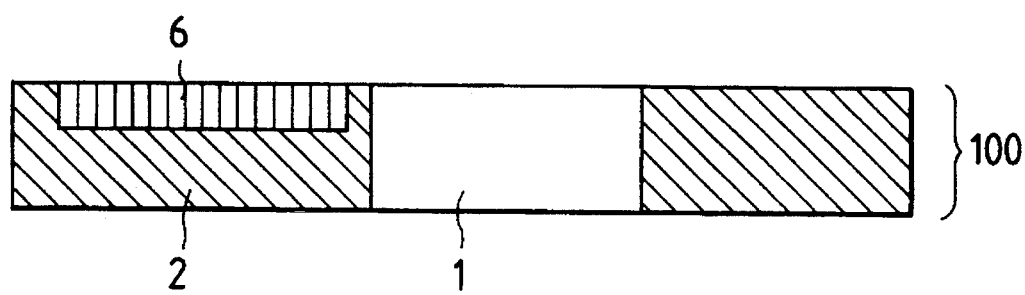
Figure 20:
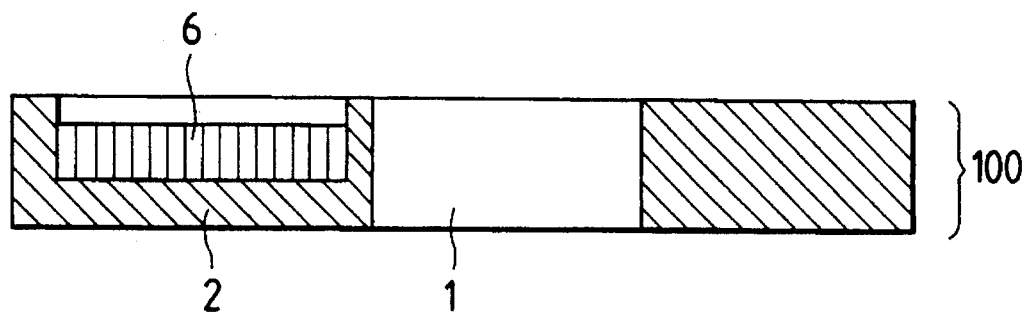

Note that the second circuit connecting part 6 can be made by embedding the metallic wiring or wire into the mounting plate 2. FIGS. 18 to 20 are cross-sectional views showing preferred base boards 100 having the metallic wiring or wire embedded into the mounting plate 2, respectively, wherein FIG. 18 corresponds to a case where the upper surface of the second circuit connecting part is above the upper surface of the mounting plate 2, FIG. 19 corresponds to a case where the upper surface of the second circuit connecting part is flush with the upper surface of the mounting plate 2, and FIG. 20 corresponds to a case where the upper surface of the second circuit connecting part is below the upper surface of the mounting plate 2. The embedding of metallic wiring or wire can be effected simultaneously in the fabrication process of the mounting plate 2 (FIGS. 8A to 8G).

In FIGS. 18 to 20, 6 is a second circuit connecting part having a metallic wiring or wire. The connection of the metallic wiring or wire to the first circuit connecting part 1a may be made by WB (wire bonding).

(Example 5)

Figure 21:
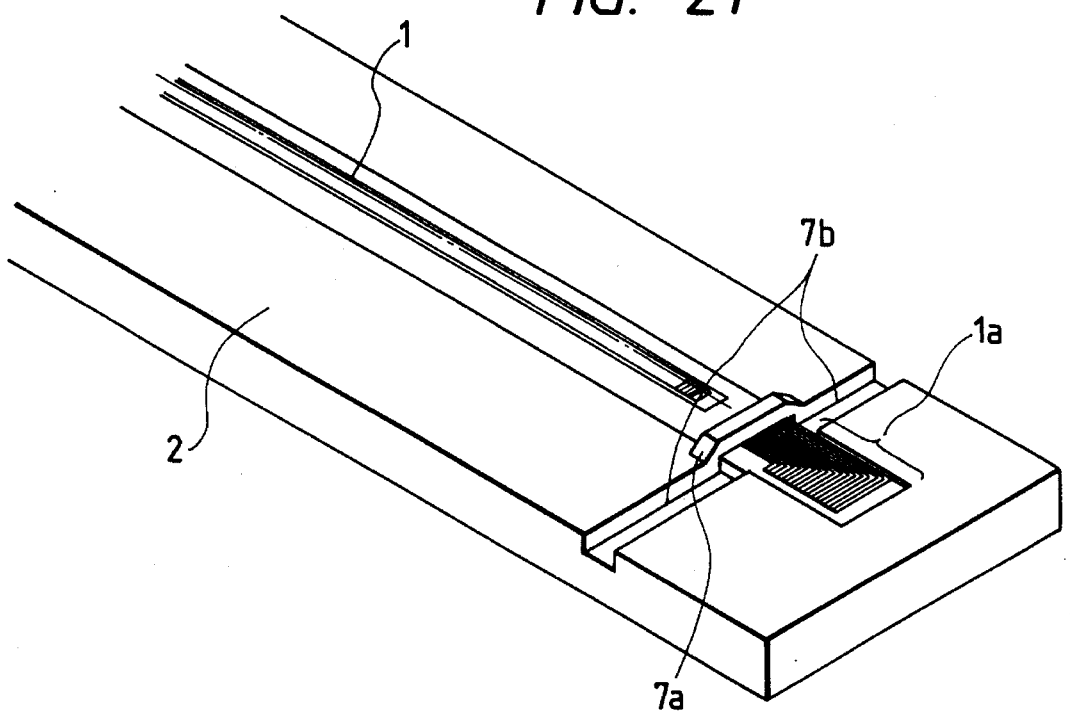
Figure 22:
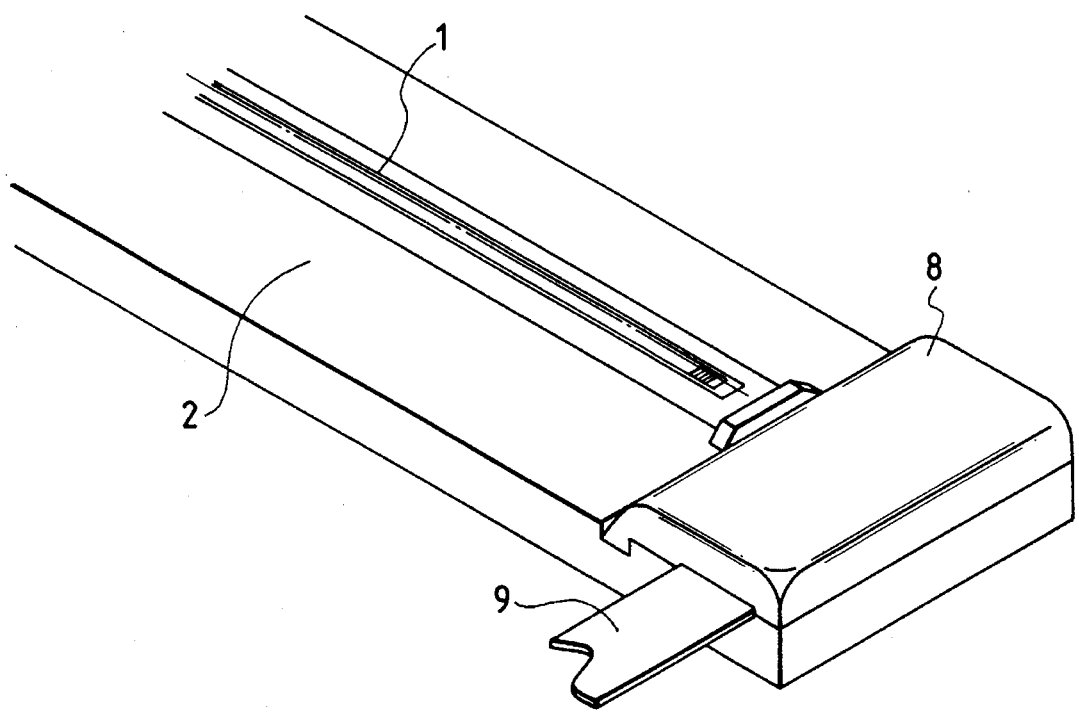

FIG. 21 is a perspective view of a photoelectric conversion device in this example, and FIG. 22 is a perspective view showing the case where a sealing member is provided on the photoelectric conversion device.

This example is provided with an antisagging portion (concave portion) 7b for preventing the sealing material 8 from flowing away and an antisagging portion (bank portion) 7a particularly for preventing the sealing material from flowing out to the photosensor substrate, as shown in FIGS. 21 and 22. The first circuit connecting part 1a and a flexible printed board 9 are connected with a wire bonding. Also, when the mounting plate 2 has IC mounted, it is possible that the first circuit connecting part 1a is connected to IC, which is in turn connected to the flexible printed board 9. The sealing material 8 is composed of epoxy or silicone resin, and provided for the protection of the wiring portion and wire bonding portion.

Figure 23A:
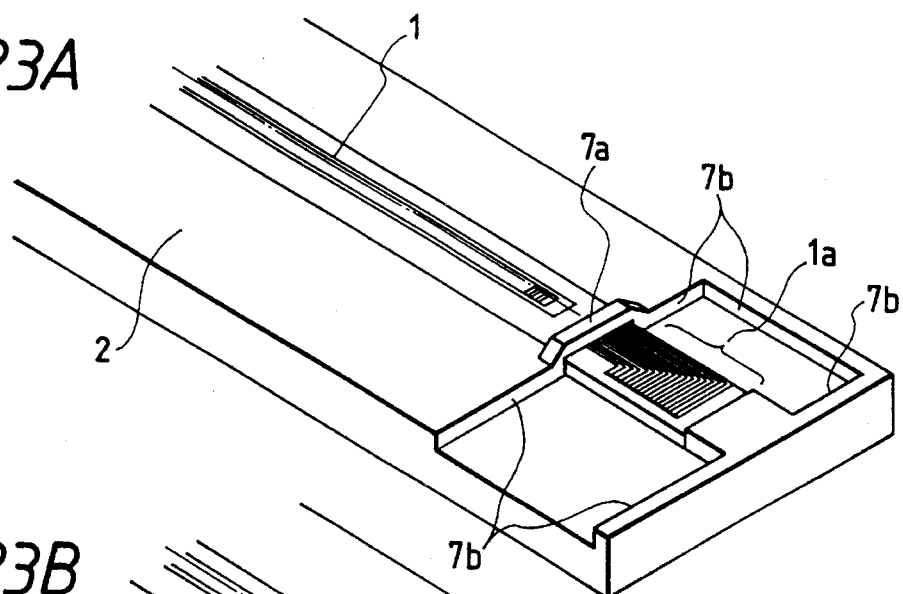
Figure 23B:
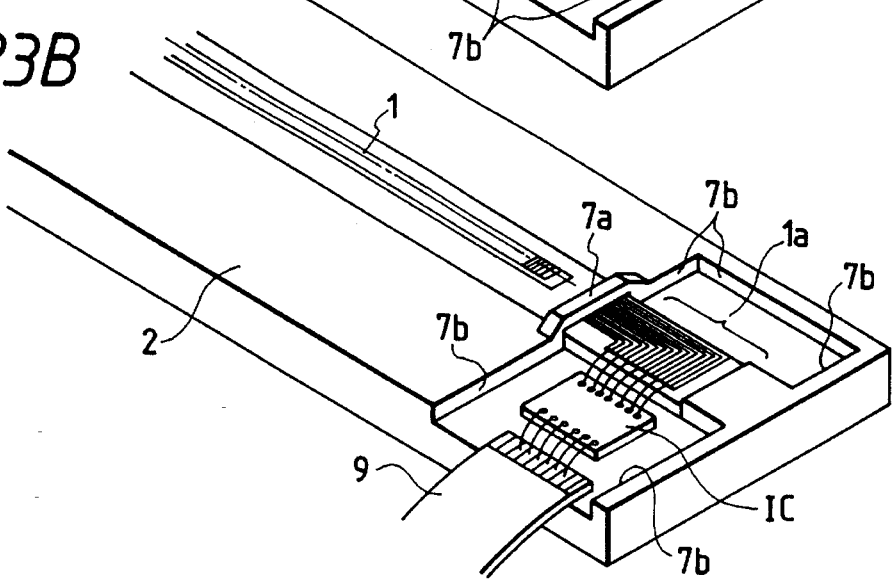

FIG. 23A is a perspective view showing a preferable example when the antisagging section 7b is widened, and FIG. 23B is a perspective view when IC is disposed within the concave portion of FIG. 23A.

Figure 24:
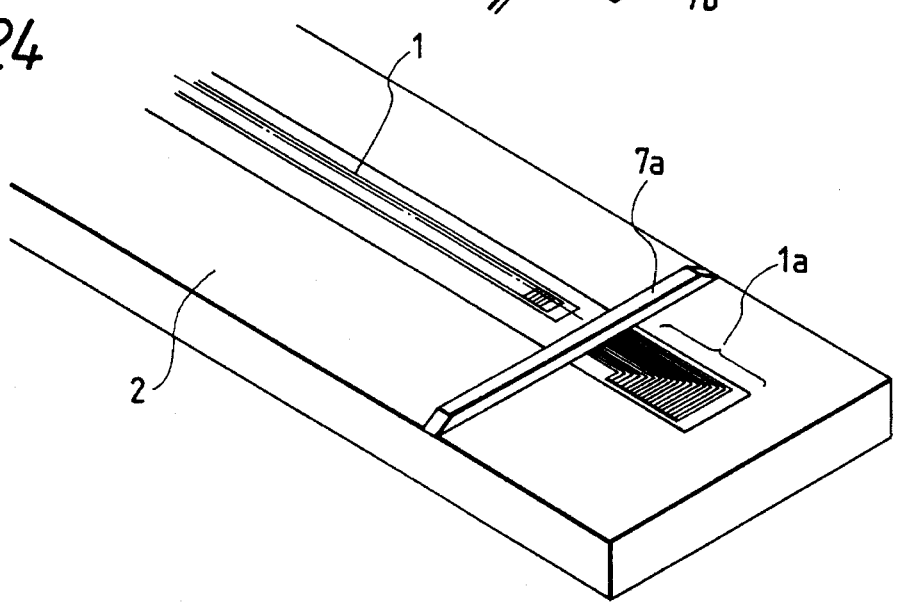

FIG. 24 is a perspective view showing another preferable example when the bank portion 7a is widened linearly.

For the antisagging of sealing resin, it is necessary to create the antisagging portion by applying a resin for the bank member in a frame-like configuration by means of a dispenser, but in this example, the bank portion 7a and the concave portion 7b can be simultaneously formed of the same material as that of the mounting plate in the process where the photosensor substrate and the mounting plate are integrally formed, without the necessity of any special process for forming the antisagging portion. Also, the sealing member can be securely fixed, resulting in better sealing precision and easier sealing operation.

(Example 6)

Figure 25:
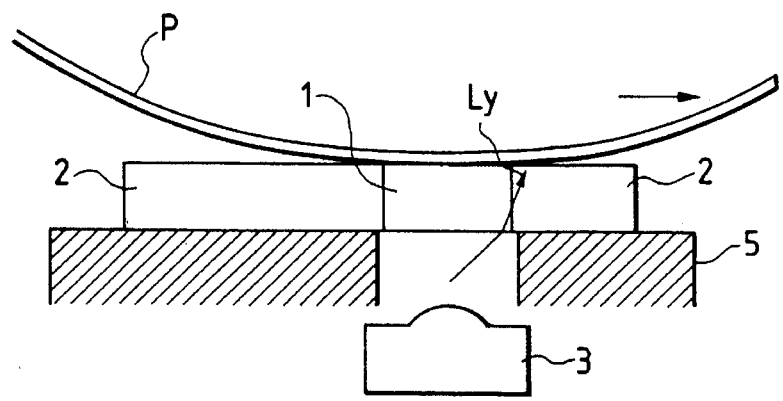

FIG. 25 is a cross-sectional view of a photoelectric conversion device in this example.

This example suppresses stray light using a light transparent material for the mounting plate 2. That is, it is considered that stray light is mainly produced by the reflection from the side face of the photosensor substrate 1, but since in this example, light entering the side surface of the photosensor substrate 1 will penetrate through the mounting plate 2, the influence of stray light can be reduced.

(Example 7)

Figure 26:
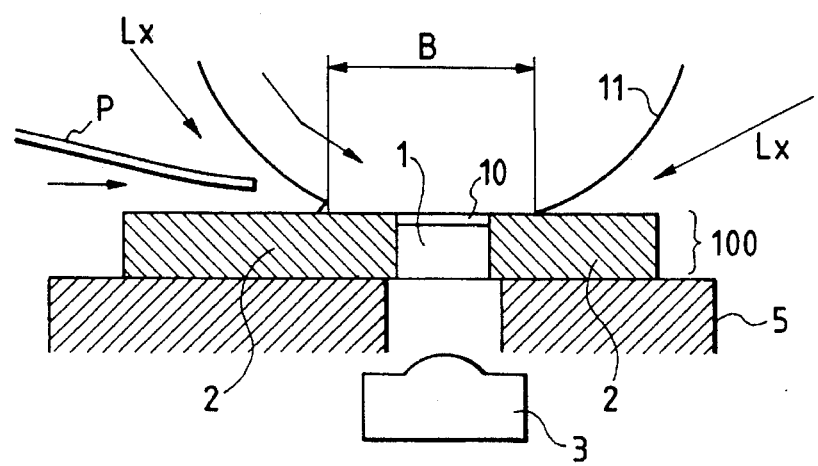

FIG. 26 is a cross-sectional view of a photoelectric conversion device in this example.

This example is set forth in that the width of photosensor substrate 1 is smaller than the nip width B (collapse width of roller) for an image holding member conveying unit 11 such as a platen roller, as shown in FIG. 26. In this way, by making the width of photosensor substrate 1 below the nip width B, external light Lx is reduced and the S/N ratio is improved. In this case, if the photoelectric conversion elements of the photosensor substrate 1 are disposed in a central or substantially central portion of the nip width B, the influence of external light Lx incident from the both ends of the contact portion between the image holding member conveying unit 11 and the base board 100 (across the nip width B) can be suppressed evenly.

It is desirable that the photoelectric conversion elements are disposed in the central or substantially central portion of the photosensor substrate 1. This is because if the interval between one side of the photosensor substrate 1 and the photoelectric conversion elements is too short, the influence of stray light from one side of the photosensor substrate 1 may increase in some cases. Also, in this case, the mounting plate 2 is desirably opaque or substantially opaque. This is to prevent external light from penetrating through the mounting plate.

Note that the term "opaque" means that the light of wavelength involving the photoelectric conversion is not transmitted therethrough, and for example, the photoelectric conversion element having insignificant sensitivity to infrared ray is opaque even if an infrared ray is transmitted. Also, the term "substantially opaque" means that the light is transmitted to a degree not to impede a photoelectric conversion required.

(Example 8)

Figure 27:
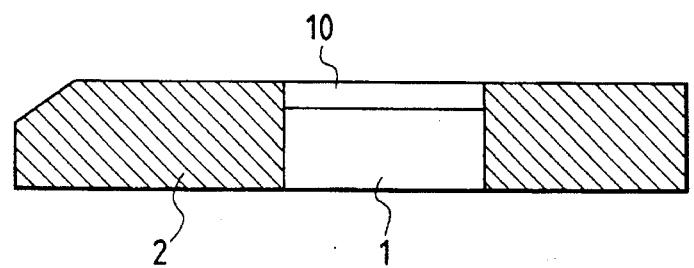
Figure 28:
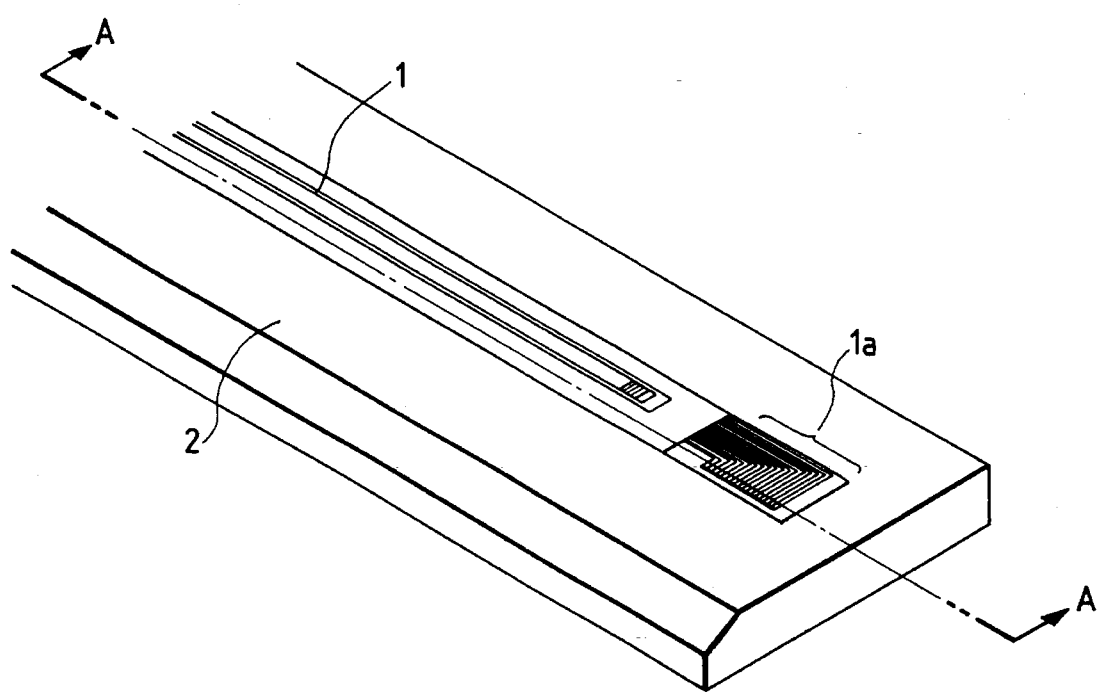
Figure 29:
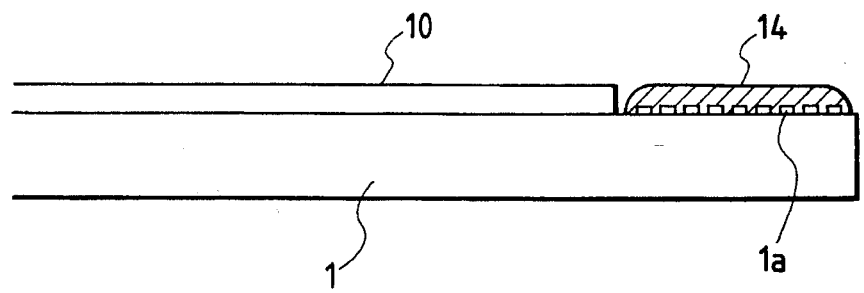
FIG. 29 is a cross-sectional view of a photoelectric conversion device of the present invention in a direction where a photoelectric conversion element array is arranged.

FIGS. 27 to 29 are a longitudinal cross-sectional view, a perspective view and a side cross-sectional view of a photoelectric conversion device in this example, respectively.

This example is set forth in that the base board 100 is made by providing a protective mask 14 on the first circuit connecting part 1, and integrating the photosensor substrate and the mounting plate in the manufacturing process as shown in FIGS. 8A to 8G. In this way, by providing the mask on the circuit connecting part for the molding, the following effects are provided:

1. The circuit connecting part is less susceptible to flaw.
2. The mask, if left behind partially, can be utilized as the passivation film.

Thus, several examples of the photoelectric conversion device for the image reading have been described above, wherein the photoelectric conversion device for the image reading according to the present invention can be employed for the image processing apparatus such as a facsimile apparatus.

Figure 30:
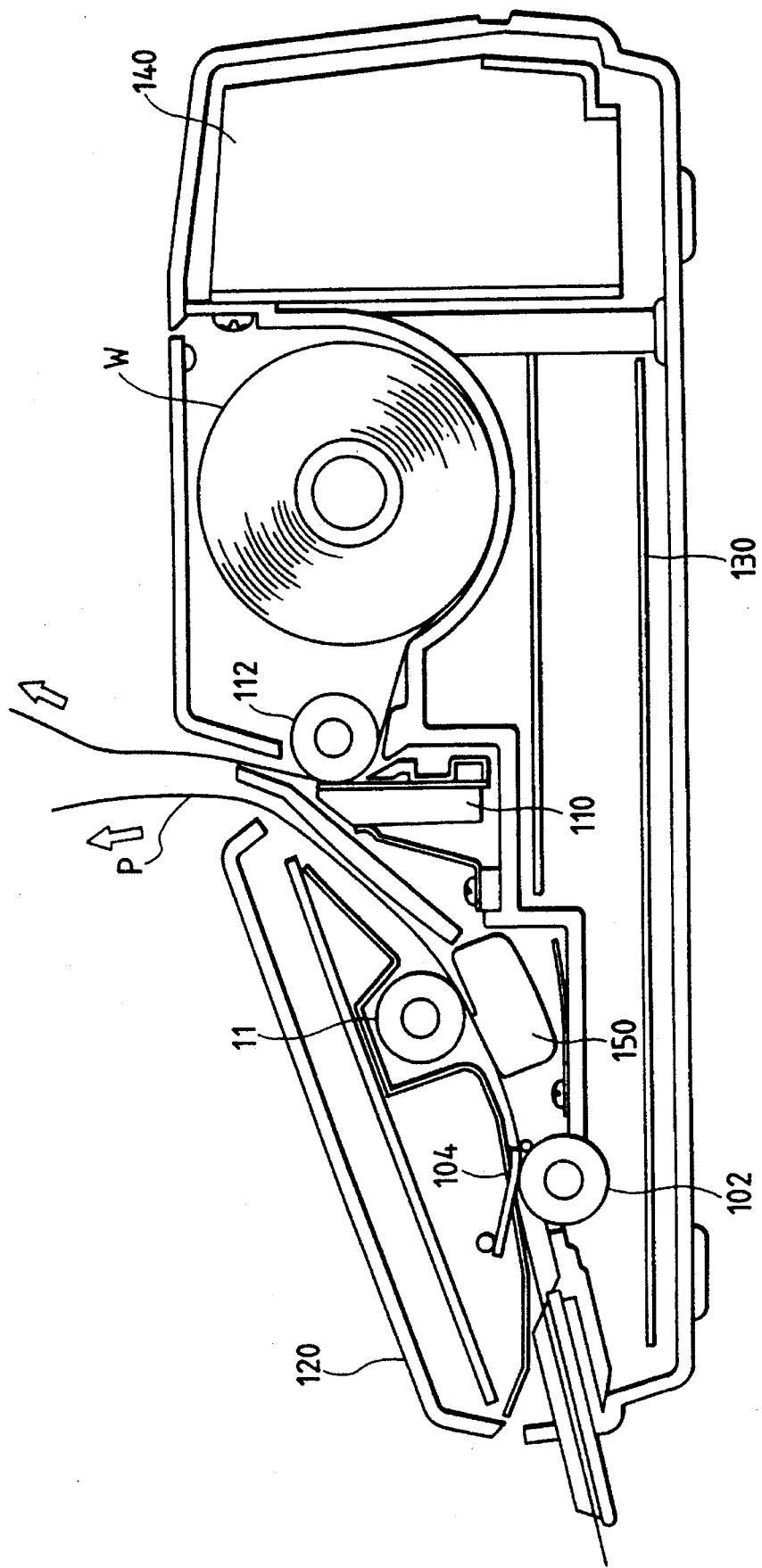
FIG. 30 is a schematic constitutional view of the information processing apparatus.

FIG. 30 is a schematic constitutional view showing an image processing apparatus comprised of a photoelectric conversion device for the image reading according to the present invention and a facsimile having the communication facility.

In the same figure, 102 is a feed roller as the feeding unit for feeding original P to the reading position, and 104 is a separator for separating one sheet from originals P to be fed.

11 is a platen roller for regulating the read face of original P located at the reading position of a sensor unit 150 using the photoelectric conversion device of the present invention, as well as conveying the original P.

W is a recording medium in the form of a roll in this example as shown, on which image information read by the sensor unit 150 or image information transmitted from the external to the facsimile is formed. 110 is a recording head as the recording .unit to form the image, for which various types of heads such as a thermal head and an ink jet recording head can be employed. Al so, this recording head may be of the serial type or line type. 112 is a platen roller for conveying the recording medium W to the recording position by the recording head 110, as well as regulating the record face thereof. Note that the output unit may be a recorder with the electrophotographic technique. In this case, it has at least a photosensitive drum, an exposure unit, an electrifying unit and a developing unit.

120 is an operation panel on which the switches for enabling the operation input and a display for displaying various messages and the status of the apparatus are arranged.

130 is a system control substrate as the control unit, on which are provided a control unit (controller) for controlling each unit, a driving circuit (driver) for the photoelectric conversion element, a processing unit (processor) for the image information, and a transmission and reception unit. 140 is a power source of the apparatus.

The recording unit for use in the image processing apparatus as described above is preferably those having the representative constitution and principle disclosed in, for example, U.S. Pat. Nos. 4,723,129 and 4,740,796. This system is effective because, by applying at least one driving signal which gives rapid temperature elevation exceeding nucleus boiling corresponding to the recording information on electricity-heat converters arranged corresponding to the sheets or liquid channels holding a liquid (ink), heat energy is generated at the electricity-heat converters to effect film boiling at the heat acting surface of the recording head, and consequently the bubbles within the liquid (ink) can be formed corresponding one by one to the driving signals. By discharging the liquid (ink) through an opening for discharging by growth and shrinkage of the bubble, at least one droplet is formed.

As the driving signals, those as disclosed in U.S. Pat. Nos. 4,463,359 and 4,345,262 are suitable. Further excellent recording can be performed by employment of the conditions described in U.S. Pat. No. 4,313,124 of the invention concerning the temperature elevation rate of the above-mentioned heat acting surface.

As the constitution of the recording head, in addition to the combination of the discharging orifice, liquid channel, and electricity-heat converter (linear liquid channel or angled liquid channel) as disclosed in the above-mentioned respective specifications, the constitution by use of U.S. Pat. No. 4,558,333 or 4,459,600 disclosing the constitution having the heat acting portion arranged in the flexed region is also included in the present invention.

In addition, the present invention can be also effectively made the constitution as disclosed in Japanese Laid-Open Patent Application No. 59-123670 which discloses the constitution using a slit common to a plurality of electricity-heat converters as the discharging portion of the liquid or Japanese Laid-Open Patent Application No. 59-138461 which discloses the constitution having the opening for absorbing pressure wave of heat energy correspondent to the discharging portion.

Further, the recording head of the full line type having a length corresponding to the maximum width of a recording medium which can be recorded by the recording device may be used, for which either the constitution which satisfies its length by a combination of a plurality of recording heads or the constitution as one recording head integrally formed may be used.

In addition, the present invention is effective for a recording head of the freely exchangeable chip type which enables electrical connection to the main device or supply of ink from the main device by being mounted on the main device, or a recording head of the cartridge type having an electrical connection or an ink tank integrally provided on the recording head itself.

Also, addition of a restoration means for the recording head, a preliminary auxiliary means, etc., provided as the constitution of the information processing device of the present invention is preferable, because a further maintenance-free device can be effected.

Specific examples of these may include, for the recording head, capping means, cleaning means, pressurization or suction means, electricity-heat converters or another type of heating means for heating the recording head, and it is also effective for performing stable recording to perform preliminary discharge mode which performs discharging separate from recording.

Further, as the recording mode, the present invention is extremely effective for not only the recording mode only of a primary color such as black, etc., but also a device equipped with at least one of plural different colors or full color by color mixing, whether the recording head may be either integrally constituted or combined in plural number.

In addition, though liquid (ink) is used in the above description, the ink may be in the solid or soft state at room temperature. The ink is only necessary to liquefy when a recording enable signal is issued as it is common with the ink jet device to control the viscosity of ink to be maintained within a certain range of the stable discharge by adjusting the temperature of ink in a range from 30° C. to 70° C. In addition, the ink may be used in the state from solid to liquid by positively utilizing the temperature elevation due to heat energy.

Next, an ink jet recording head useful for the recording system of discharging the liquid by the use of heat energy will be described briefly.

Figure 31:
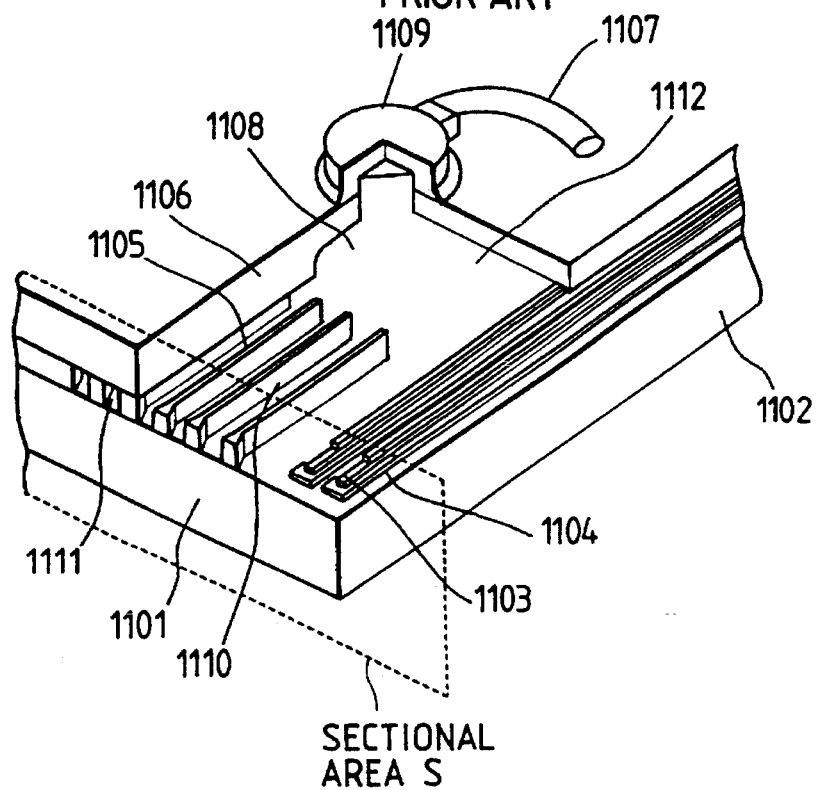
FIG. 31 is a perspective view illustrating an ink jet recording head applicable to the information processing apparatus of the present invention.

FIG. 31 is a schematic constitutional view for explaining an example of such ink jet recording head, comprising electricity-heat converters 1103, electrodes 1104, liquid channels 1105, and a ceiling plate 1106 formed as the film on a substrate 1102 through the semiconductor manufacturing process including etching, vapor deposition, and sputtering. Recording liquid 1112 is supplied from a liquid storage chamber not shown through a liquid supply tube 1107 to a common liquid chamber 1108 of the recording head 1101. In the figure, 1109 is a connector for the liquid supply tube.

Liquid 1112 supplied into the common liquid chamber 1108 is then supplied into the liquid channels 1110 owing to so-called capillary phenomenon, and stably held by forming a meniscus on each discharge opening (orifice) at the top end of liquid channel. Herein, by conducting electricity to the electricity-heat converters 1103, the liquid on the surface of the electricity-heat converters is rapidly heated, bubbles are produced in the liquid, and owing to expansion and shrinkage of bubbles, the liquid is discharged through the discharge opening 1111 to form a minute liquid droplet.

With the constitution as described, if 128 or 256 discharge openings are provided in an array of discharge openings at a high density of 16 nozzles/mm or more, an ink jet head of the full line type in which discharge openings are arranged over the entire area of the recording width can be formed.

Figure 32:
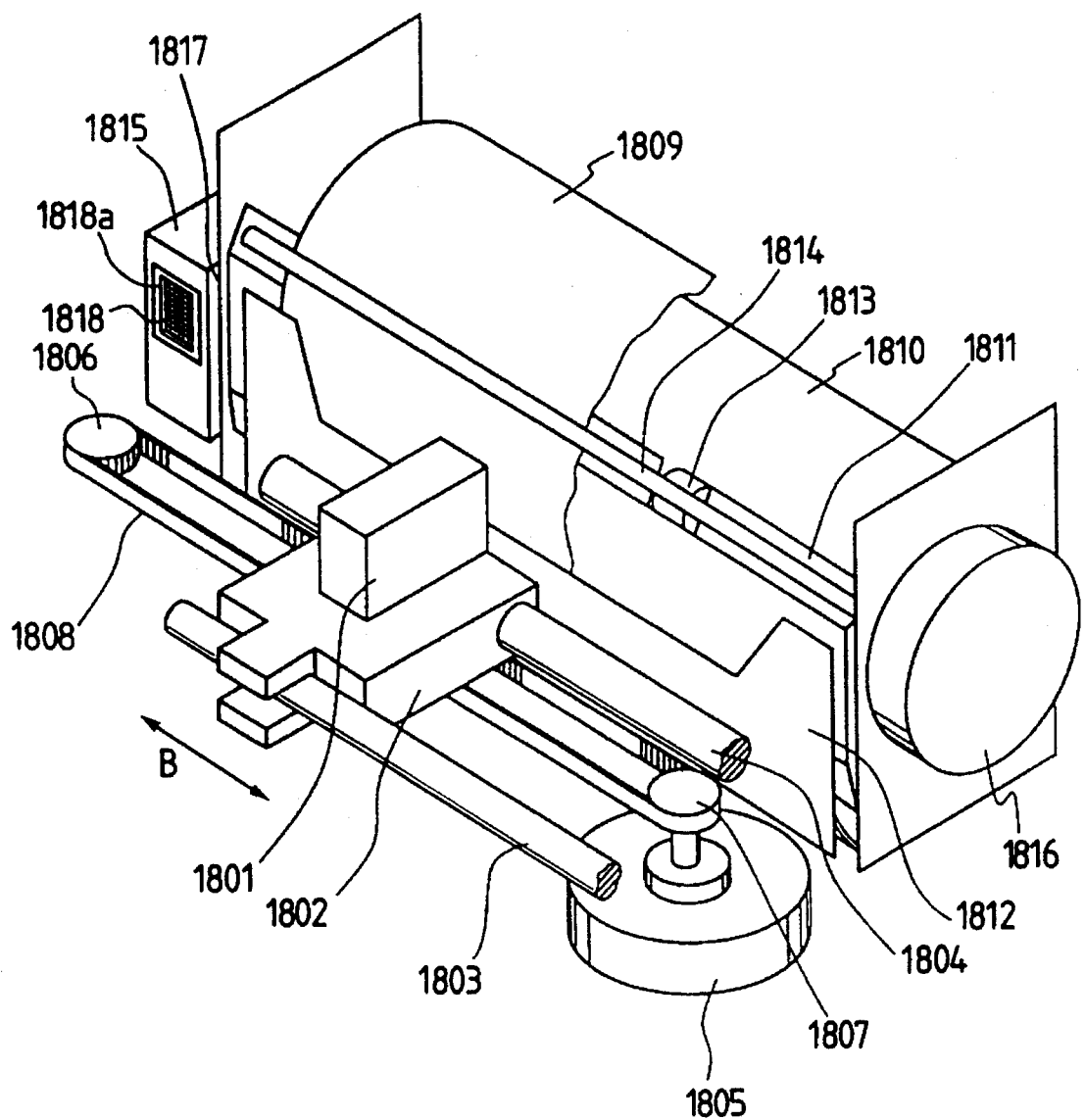
FIG. 32 is a perspective view showing a recording unit using an ink jet recording method applicable to the information processing apparatus of the present invention.

FIG. 32 is a perspective view showing schematically the constitution of an output unit using the ink jet recording system.

In the figure, 1801 is an ink jet recording head (hereinafter referred to as a recording head) for recording a desired image, and 1802 is a carriage for moving the recording head 1801 for scanning in a recording direction (a main scan direction). The carriage 1802 is slidably supported by guide shafts 1803, 1804, and reciprocated along the main scan direction because of its interlock with a timing belt 1801. The timing belt 1808 engaging pulleys 1806, 1807 is driven via a pulley 1807 by a carriage motor 1805.

Recording sheet 1809 is guided by a paper pan 1810, and conveyed by a paper feed roller which is pressed by a pinch roller.

This conveyance is performed by a paper feed motor 1816 as the driving source. The recording sheet 1809 thus conveyed is tensioned by a sheet exhaust roller 1813 and a spur 1814, and conveyed in contact with a heater 1811 under a paper presser plate 1812 formed of an elastic material. The recording sheet 1809 onto which the ink discharged from the recording head 1801 is deposited is heated by the heater 1811, and the deposited ink is fixed on the recording sheet 1809 with its water content vaporized.

1815 is a unit called a restoration system, which serves to maintain the discharge characteristics in normal state by removing the foreign matter adhering to the discharge openings (not shown) of the recording head 1801, or the ink with greater viscosity.

1818a is a cap constituting a part of the restoration system unit 1815, which serves to prevent clogging from occurring by capping the discharge openings of the recording head 1801. Within the cap 1818a, it is desirable to dispose an ink absorbing member 1818.

Also, on the recording area side for the restoration system unit 1815 is provided a blade 1817 for cleaning off the foreign matter or the ink adhering to the discharge-opening face by contact with the face where the discharge openings are formed.

Figure 33:
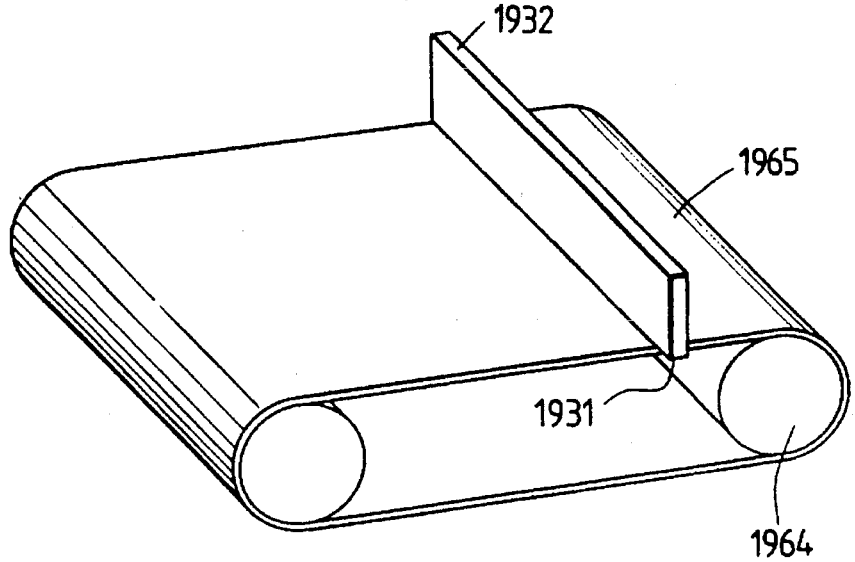
FIG. 33 is a perspective view showing a recording unit using an ink jet recording method applicable to the information processing apparatus of the present invention.

An output unit with a full-line type recording head 1932 mounted is schematically shown in FIG. 33.

In FIG. 33, 1965 is a conveying belt for conveying the recording medium, this conveying-belt 1965 conveying the recording medium not shown while a conveying roller 1964 is rotating. The lower face of recording head 1932 is a discharge opening face 1931 where a plurality of discharge openings are arranged corresponding to the recording area of the recording medium.

In this case, the recording can be performed in a similar way to that of the serial type previously described.

Of course, the output section as described above has been taken as an example, and many variations can be conceived.

However, when employing the system of discharging the liquid by the use of heat energy as described above, it is possible to effect not only the smaller construction but also the higher definition recording, whereby the effects of the invention can be further exhibited, and the information processing apparatus becomes extremely superior.

Figure 34:
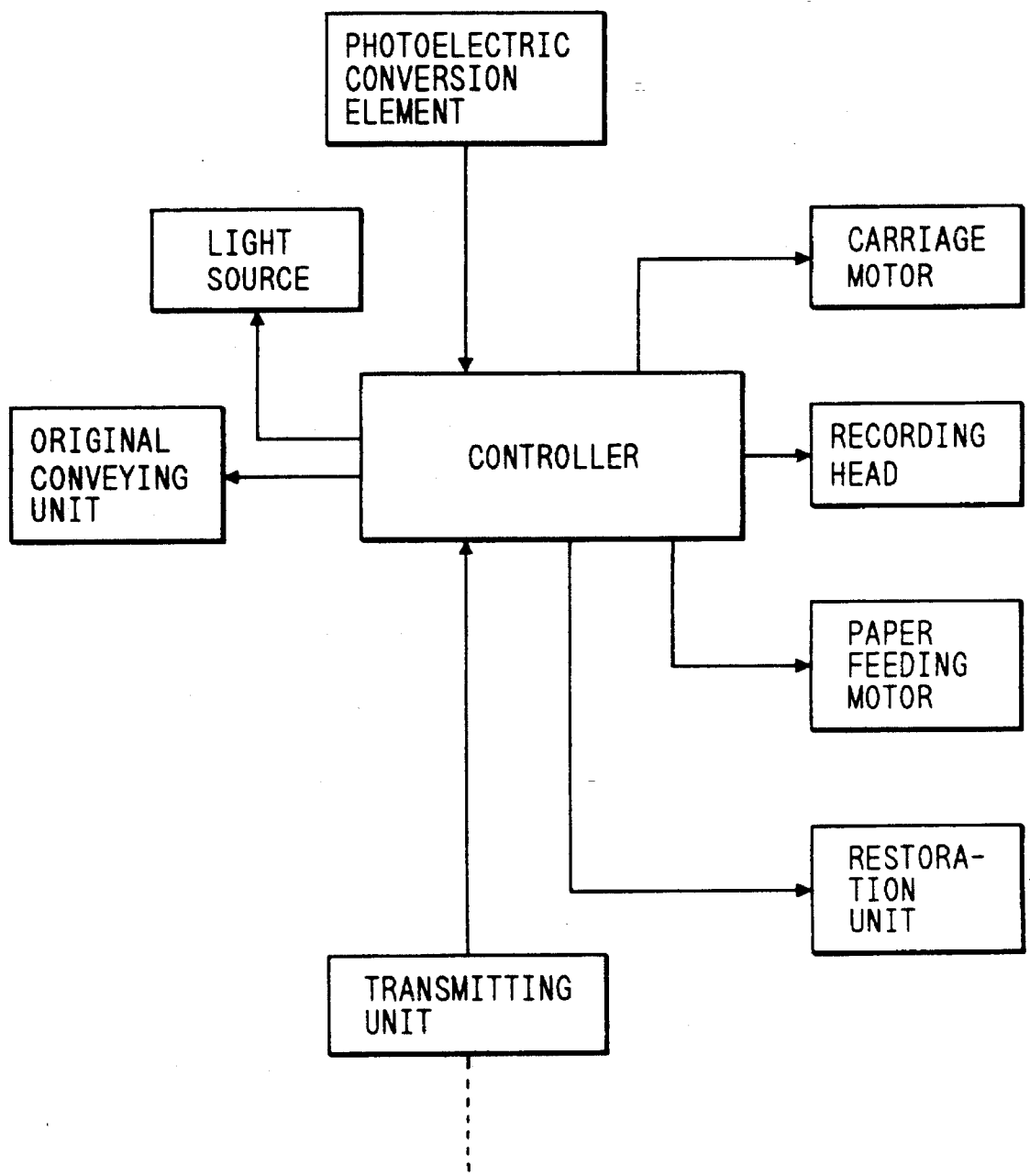
FIG. 34 is a block configuration diagram for explaining a configuration of the information processing apparatus of the present invention.

FIG. 34 is a block diagram of a system applicable to the information processing apparatus.

Light from a light source illuminates the original P to be conveyed by an original conveying unit, and light information from the original P is read by the photoelectric conversion elements. A controller controls the recording head (of the ink jet system in this case) to be moved for scanning by a carriage motor, the recording head recording read information by the photoelectric conversion elements or information received from the outside onto the recording sheet to be conveyed by a paper feed motor. A restoration unit serves to maintain the discharge characteristic in normal state by removing the foreign matter or thickened ink in the ink discharge openings of the recording head. A transmitting unit transmits information read by the photoelectric conversion elements and receives information from the outside.

In the present invention, an electrical signal carrying image information is converted into a electrical signal for the recording by the image processing unit, as shown in a block diagram of FIG. 34, and the controller such as a CPU (Central Processing Unit) controls the recording to be performed by cooperation of the carriage motor, paper feed motor and restoration device.

Note that the electrical signal carrying image information is transmitted via the transmitting unit to another image processing apparatus, which may output information, or from which information is received by the transmitting unit to perform the recording with the recording head.

As described above, with the photoelectric conversion device of the invention, the width of photosensor substrate can be reduced without producing any unfocused image or oblique running of original, so that the photoelectric conversion device and the information processing apparatus having the device can be fabricated at the lower costs and in smaller size.

Also, with the photoelectric conversion device of the invention, the mounting operation onto another member can be facilitated, and the mounting precision can be enhanced. Also, the transparent support substrate can be unnecessary, the number of components can be reduced, and the smaller and lighter construction can be made. Also, the warpage arising due to thermal shrinkage in forming the mounting plate can be corrected.

Also, with the photoelectric conversion device of the invention, the fabrication process of the first circuit connecting part can be simplified.

Also, with the photoelectric conversion device of the invention, the external light can be prevented from penetrating through the mounting plate.

Also, with the photoelectric conversion device of the invention, the stray light can be prevented from entering, whether the width of photosensor substrate is large or small.

Also, with the photoelectric conversion device of the invention, image information can be read by placing the image holding member in proximity with the photoelectric conversion elements.

Also, with the photoelectric conversion device of the invention, the first circuit connecting part and the second circuit connecting part can be connected in the simple fabrication process.

Also, with the photoelectric conversion device of the invention, the external light can be prevented from entering and the S/N ratio can be enhanced.

Also, with the photoelectric conversion device of the invention, the influence of the stray light on the photosensor substrate can be prevented.

Also, with the photoelectric conversion device of the invention, the patterned wiring can be collectively formed.

Also, with the photoelectric conversion device of the invention, the fabrication of the second circuit connecting part and the fabrication of the mounting plate can be performed simultaneously, and the protection of the wiring portion can be effected.

Also, with the photoelectric conversion device of the invention, the protection of circuit wiring portion and the protection of wire bonding portion can be effected.

Also, with the photoelectric conversion device of the invention, the effect of preventing the external light can be further enhanced.

Also, with the photoelectric conversion device of the invention, the fabrication process of wiring can be simplified by forming collectively the second circuit connecting part as patterned, and simultaneously making a connection to the first circuit connecting part.

Also, with the photoelectric conversion device of the invention, the sealing material can be prevented from flowing into any other area than the circuit connecting part.

Also, with the photoelectric conversion device of the invention, the antisagging portion can be fabricated at the same time with the mounting plate.

Also, with the information processing apparatus of the invention, the image processing apparatus can be produced with further lower costs and in smaller size.

Note that the present invention is limited to the above examples, but it will be understood that any combination can be made within the spirit and scope of the invention, and appropriate variations can be effected as necessary.

What is claimed is:

1. A photoelectric conversion device comprising:
   a photosensor substrate having plural photoelectric conversion elements on a light transparent substrate; and
   a mounting plate having a resin covering a side of said photosensor substrate,
   wherein there is a region where the surface of said mounting plate and at least a part of the surface of said photosensor substrate are substantially continuous and mounting plate has a convex or concave section to be used as a reference in mounting the mounting plate on an another member, in the direction of arranging said photoelectric conversion elements.

2. A photoelectric conversion device according to claim 1, characterized in that said photosensor substrate has a first circuit connecting part for electrically connecting said photoelectric conversion elements to an external circuit.

3. A photoelectric conversion device according to claim 1, characterized in that said mounting plate is opaque.

4. A photoelectric conversion device according to claim 1, characterized in that said mounting plate is transparent.

5. A photoelectric conversion device according to claim 1, characterized in that light penetrating through said photosensor substrate illuminates an image holding member, and light reflected from said image holding member is received by said photoelectric conversion elements to read image information.

6. A photoelectric conversion device according to claim 2, characterized in that said mounting plate has a second circuit connecting part for electrically connecting to said first circuit connecting part.

7. A photoelectric conversion device according to claim 3, characterized in that the width of said photosensor substrate is smaller than the nip width of a platen roller conveying an image holding member.

8. A photoelectric conversion device according to claim 4, characterized in that said photoelectric conversion elements are disposed in a central portion or substantially central portion of said photosensor substrate in a width direction.

9. A photoelectric conversion device according claim 6, characterized in that said second circuit connecting part has wirings formed of a conductive paste.

10. A photoelectric conversion device according to claim 6, characterized in that said second circuit connecting part is integrally formed within said mounting plate.

11. A photoelectric conversion device according to claim 6, characterized in that said first circuit connecting part and said second circuit connecting part are covered with a sealing material.

12. A photoelectric conversion device according to claim 7, characterized in that said photoelectric conversion elements are disposed in a central portion or substantially central portion of said nip width.

13. A photoelectric conversion device according to claim 9, characterized in that said second circuit connecting part is formed on a terminal portion of said first circuit connecting part and said mounting plate simultaneously.

14. A photoelectric conversion device according to claim 11, characterized in that an antisagging portion of sealing material is formed at least in part around the periphery of said first circuit connecting part and said second circuit connecting part.

15. A photoelectric conversion device according to claim 14, characterized in that said antisagging portion is made of a resin of the mounting plate.

16. A photoelectric conversion device according to claim 1, characterized in that a transparent protective layer is provided on said photoelectric conversion elements.

17. A photoelectric conversion device according to claim 16, characterized in that said transparent protective layer has a thin plate glass.

18. A photoelectric conversion device according to claim 1, characterized in that said mounting plate and said photosensor substrate is in axial symmetry with an array of said photoelectric conversion elements.

19. An information processing apparatus comprising:
  a photoelectric conversion device comprising a photosensor substrate having plural photoelectric conversion elements on a light transparent substrate; and
  a mounting plate having a resin covering a side of said photosensor substrate, wherein there is a region where the surface of said mounting plate and at least a part of the surface of said photosensor substrate are substantially continuous, and said mounting plate has a convex or concave section to be used as a reference in mounting on an another member;
  a base plate for holding said photoelectric conversion device for the image reading;
  a light source for illuminating an image holding member;
  a conveying unit for conveying said image holding member; and
  a controller for controlling at least one of said photoelectric conversion device for the image reading, said light source and said conveying unit,
  wherein said photoelectric conversion device for the image reading is mounted on said base plate based on the mounting reference.

20. An information processing apparatus according to claim 19, characterized in that said mounting plate has a convex or concave portion as the mounting reference with another member.

21. An information processing apparatus according to claim 19, characterized in that said photosensor substrate has a first circuit connecting part for electrically connecting said photoelectric conversion elements to an external circuit.

22. An information processing apparatus according to claim 19, characterized in that said mounting plate is opaque.

23. An information processing apparatus according to claim 19, characterized in that said mounting plate is transparent.

24. An information processing apparatus according to claim 19, characterized in that light penetrating through said photosensor substrate illuminates an image holding member, and light reflected from said image holding member is received by said photoelectric conversion elements to read image information.

25. An information processing apparatus according to claim 19, characterized in that said mounting plate has a second circuit connecting part for electrically connecting to said first circuit connecting part.

26. An information processing apparatus according to claim 19, characterized in that the width of said photosensor substrate is smaller than the nip width of a platen roller conveying an image holding member.

27. An information processing apparatus according to claim 19, characterized in that said photoelectric conversion elements are disposed in a central portion or substantially central portion of said photosensor substrate in a width direction.

28. An information processing apparatus according to claim 19, characterized in that said second circuit connecting part has wirings formed of a conductive paste.

29. An information processing apparatus according to claim 19, characterized in that said second circuit connecting part is integrally formed within said mounting plate.

30. An information processing apparatus according to claim 19, characterized in that said first circuit connecting part and said second circuit connecting part are covered with a sealing material.

31. An information processing apparatus according to claim 19, characterized in that said photoelectric conversion elements are disposed in a central portion or substantially central portion of said nip width.

32. An information processing apparatus according to claim 19, characterized in that said second circuit connected part is formed on a terminal portion of said first circuit connecting part and said mounting plate simultaneously.

33. An information processing apparatus according to claim 19, characterized in that an antisagging portion of sealing material is formed at least in part around the periphery of said first circuit connecting part and said second circuit connecting part.

34. An information processing apparatus according to claim 19, characterized in that said antisagging portion is made of a resin of the mounting plate.

35. An information processing apparatus according to claim 19, characterized in that a transparent protective layer is provided on said photoelectric conversion elements.

36. An information processing apparatus according to claim 35, characterized in that said transparent protective layer has a thin plate glass.

37. An information processing apparatus according to claim 19, characterized in that said mounting plate and said photosensor substrate is in axial symmetry with an array of said photoelectric conversion elements.

38. An information processing apparatus according to claim 19, further comprising an output unit for outputting records based on an electrical signal carrying image information.

39. An information processing apparatus according to claim 38, wherein said controller further controls said output unit.

40. An information processing apparatus according to claim 38, wherein said output unit is of a system selected from the thermal recording system, the ink jet recording system, and the electrophotographic recording system.

41. An information processing apparatus according to claim 40, wherein said ink jet recording system is to discharge the liquid by the use of heat energy.

42. An information processing apparatus according to claim 38, wherein said output unit is of the ink jet recording system, and has a restoration system.

43. An information processing apparatus according to claim 42, wherein said restoration system has a cap for capping an area including discharge orifices of an ink jet head.

44. An information processing apparatus according to claim 43, wherein said cap has an ink absorbing member inside.

45. An information processing apparatus according to claim 42, wherein said restoration system has a blade for cleaning off a face including discharge orifices of an ink jet head.

46. An information processing apparatus according to claim 40, wherein an ink jet head, for use with the ink jet recording system, has a plurality of discharge orifices arranged corresponding to the recording area of the recording medium.

* * * * *

UNITED STATES PATENT AND TRADEMARK OFFICE
CERTIFICATE OF CORRECTION

PATENT NO. : 5,475,211
DATED : December 12, 1995
INVENTOR(S) : MAKOTO OGURA ET AL.

It is certified that error appears in the above-indentified patent and that said Letters Patent is hereby corrected as shown below:

ON THE TITLE PAGE:

AT [56] REFERENCES CITED

```
    U.S. Patent Documents, insert
    --4459600   7/1984   Sato et al..........346/140
      4345262   8/1982   Shirato et al.......346/140
      4313124   1/1982   Hara................346/140
      4558333  12/1985   Sugitani et al......346/140
      4723129   2/1988   Endo et al..........346/1.1
      4463359   7/1984   Ayata et al.........346/1.1
      5121225   6/1992   Murata et al........358/471
      5261013  11/1993   Murata et al........382/65

Foreign Patent Documents,
     insert --59138461  8/1984  Japan
             59123670   7/1984  Japan--;
    "04247956   9/1982  Japan" should read
    --4-247956  9/1992  Japan--; and
    "03207158  10/1991  Japan" should read
    --3-207158 10/1991  Japan--.
```

UNITED STATES PATENT AND TRADEMARK OFFICE
CERTIFICATE OF CORRECTION

PATENT NO. : 5,475,211
DATED : December 12, 1995
INVENTOR(S) : MAKOTO OGURA ET AL.

It is certified that error appears in the above-indentified patent and that said Letters Patent is hereby corrected as shown below:

COLUMN 1

Line 21, "long line sensors" should read --long-line sensors,--.
    Line 35, "Of" should read --of--.
    Line 38, "devices" should read --device.--.
    Line 43, "a" (third occurrence) should read --an--.
    Line 45, "example" should read --example,--.
    Line 67, "the" should be deleted.

COLUMN 7

Line 44, "There" should read --These--.
    Line 55, "10" should be deleted.

COLUMN 9

Line 20, "has-more" should read --has more--
    Line 26, "cases" should read --cases,-- and "FIG. 13" should read --FIG. 13,--

UNITED STATES PATENT AND TRADEMARK OFFICE
CERTIFICATE OF CORRECTION

PATENT NO. : 5,475,211
DATED : December 12, 1995
INVENTOR(S) : MAKOTO OGURA ET AL.

It is certified that error appears in the above-indentified patent and that said Letters Patent is hereby corrected as shown below:

COLUMN 10

Line 6, "an" should be deleted.
Line 7, "mounting" should read --mounting an--.

COLUMN 12

Line 9, ".unit" should read --unit--.
Line 11, "Al so," should read --Also,--.

COLUMN 16

Line 35, "mounting" should read --said mounting--.

UNITED STATES PATENT AND TRADEMARK OFFICE
CERTIFICATE OF CORRECTION

PATENT NO. : 5,475,211

DATED : December 12, 1995

INVENTOR(S) : MAKOTO OGURA ET AL.

It is certified that error appears in the above-indentified patent and that said Letters Patent is hereby corrected as shown below:

<u>COLUMN 17</u>

Line 42, "continuous," should read --continuous--.
Line 44, "an" should be deleted.

Signed and Sealed this

Fourteenth Day of May, 1996

Attest:

BRUCE LEHMAN

*Attesting Officer*     *Commissioner of Patents and Trademarks*